(12) United States Patent
Hayami

(10) Patent No.: US 6,573,848 B2
(45) Date of Patent: Jun. 3, 2003

(54) MODULATION SYSTEM USING ENCODING TABLES AND METHOD THEREFOR

(75) Inventor: Atsushi Hayami, Yokohama (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 10/060,337

(22) Filed: Feb. 1, 2002

(65) Prior Publication Data

US 2002/0167426 A1 Nov. 14, 2002

(30) Foreign Application Priority Data

Mar. 9, 2001 (JP) .................................... 2001-066286

(51) Int. Cl.[7] ................................................ H03M 5/06

(52) U.S. Cl. ............................ 341/68; 341/50; 341/69; 341/61

(58) Field of Search ........................... 341/50, 61, 68, 341/69

(56) References Cited

U.S. PATENT DOCUMENTS

| | | | | |
|---|---|---|---|---|
| 5,614,901 A | * | 3/1997 | Haas | 341/68 |
| 5,764,169 A | * | 6/1998 | Toguchi | 341/68 |
| 5,790,057 A | * | 8/1998 | Linde et al. | 341/68 |
| 5,877,712 A | * | 3/1999 | Kim | 341/68 |
| 6,014,096 A | * | 1/2000 | Nakagawa et al. | 341/68 |
| 6,241,778 B1 | * | 6/2001 | de Lind van Wijngaarden et al. | 341/68 |
| 6,356,214 B1 | * | 3/2002 | McDonald et al. | 341/68 |
| 6,466,143 B2 | * | 10/2002 | Eshraghi et al. | 341/68 |

FOREIGN PATENT DOCUMENTS

| | | |
|---|---|---|
| JP | 6-195887 | 7/1994 |
| JP | 10-340543 | 12/1998 |
| JP | 11-346154 | 12/1999 |
| JP | 2000-332613 | 11/2000 |

* cited by examiner

*Primary Examiner*—Michael Tokar
*Assistant Examiner*—Lam Mai
(74) *Attorney, Agent, or Firm*—Louis Woo

(57) ABSTRACT

A 6-bit output code word is generated in response to every 4-bit input code word by referring to a set of encoding tables. The encoding tables contain output code words assigned to input code words, and contain encoding-table designation information accompanying each output code word. The encoding-table designation information designates an encoding table among the encoding tables which is used next to generate an output code word immediately following the output code word accompanied with the encoding-table designation information. Two redundant bits are added to every prescribed number of the successive generated output code words for digital-sum-variation control. The generated output code words and the added redundant bits are sequentially connected into a redundant-bit-added output-code-word sequence which follows predetermined run length limiting rules (1, k)RLL, where "k" denotes a predetermined natural number equal to 9.

13 Claims, 10 Drawing Sheets

FIG. 1

| DECIMAL | BINARY |
|---|---|
| 0 | 000000 |
| 1 | 000001 |
| 2 | 000010 |
| 4 | 000100 |
| 5 | 000101 |
| 8 | 001000 |
| 9 | 001001 |
| 10 | 001010 |
| 16 | 010000 |
| 17 | 010001 |
| 18 | 010010 |
| 20 | 010100 |
| 21 | 010101 |
| 32 | 100000 |
| 33 | 100001 |
| 34 | 100010 |
| 36 | 100100 |
| 37 | 100101 |
| 40 | 101000 |
| 41 | 101001 |
| 42 | 101010 |

FIG. 2

| ID NUMBER | 0 | | | 1 | | | 2 | | | 3 | | |
|---|---|---|---|---|---|---|---|---|---|---|---|---|
| D(k) | | C(k) | S(k+1) | | C(k) | S(k+1) | | C(k) | S(k+1) | | C(k) | S(k+1) |
| 0 | 1 | 000001 | 0 | 9 | 001001 | 0 | 33 | 100001 | 0 | 41 | 101001 | 0 |
| 1 | 1 | 000001 | 1 | 9 | 001001 | 1 | 33 | 100001 | 1 | 41 | 101001 | 1 |
| 2 | 17 | 010001 | 0 | 5 | 000101 | 0 | 17 | 010001 | 0 | 37 | 100101 | 0 |
| 3 | 17 | 010001 | 1 | 5 | 000101 | 1 | 17 | 010001 | 1 | 37 | 100101 | 1 |
| 4 | 18 | 010010 | 2 | 2 | 000010 | 2 | 18 | 010010 | 2 | 34 | 100010 | 1 |
| 5 | 18 | 010010 | 3 | 2 | 000010 | 3 | 18 | 010010 | 3 | 34 | 100010 | 2 |
| 6 | 18 | 010010 | 0 | 2 | 000010 | 1 | 18 | 010010 | 1 | 34 | 100010 | 3 |
| 7 | 21 | 010101 | 1 | 4 | 000100 | 2 | 36 | 100100 | 2 | 21 | 010101 | 0 |
| 8 | 21 | 010101 | 2 | 4 | 000100 | 3 | 36 | 100100 | 3 | 21 | 010101 | 1 |
| 9 | 20 | 010100 | 3 | 4 | 000100 | 1 | 36 | 100100 | 1 | 20 | 010100 | 2 |
| 10 | 20 | 010100 | 2 | 10 | 001010 | 2 | 42 | 101010 | 3 | 20 | 010100 | 3 |
| 11 | 20 | 010100 | 3 | 10 | 001010 | 3 | 42 | 101010 | 2 | 20 | 010100 | 2 |
| 12 | 0 | 000000 | 2 | 10 | 001010 | 1 | 42 | 101010 | 1 | 32 | 100000 | 3 |
| 13 | 0 | 000000 | 3 | 8 | 001000 | 2 | 40 | 101000 | 2 | 32 | 100000 | 2 |
| 14 | 16 | 010000 | 2 | 8 | 001000 | 3 | 40 | 101000 | 3 | 16 | 010000 | 3 |
| 15 | 16 | 010000 | 3 | 8 | 001000 | 1 | 40 | 101000 | 2 | 16 | 010000 | 3 |

FIG. 5
| INPUT CODE WORD D(k) | CURRENT-TABLE SELECTION NUMBER S(k) | OUTPUT CODE WORD C(k) | NEXT-TABLE SELECTION NUMBER S(k+1) |
|---|---|---|---|
| 4 | 0 | 18 | 1 |
| 5 | 1 | 2 | 2 |
| 6 | 2 | 18 | 3 |
| 7 | 3 | 21 | 0 |
| 8 | 0 | 21 | 1 |
FIG. 7
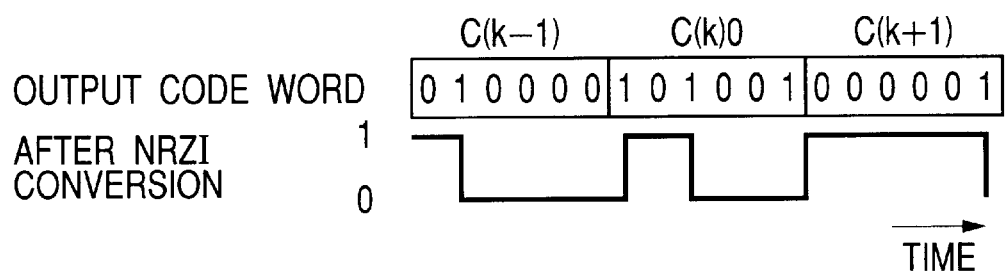
FIG. 8
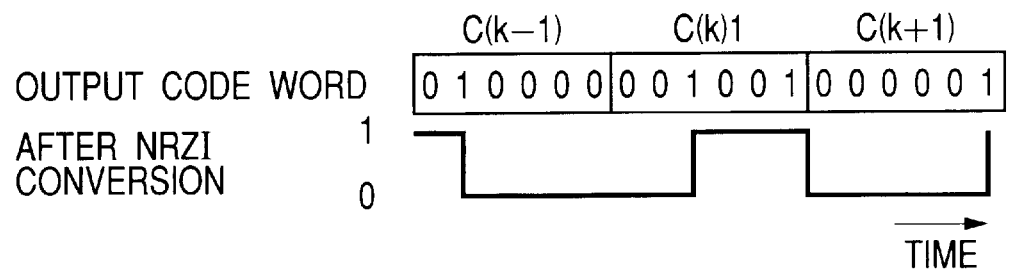

FIG. 12

| C(k−1) | | DECISION INFORMATION | D(k−1) | | | |
|---|---|---|---|---|---|---|
| DECIMAL | BINARY | | S(k)=0 | S(k)=1 | S(k)=2 | S(k)=3 |
| 0 | 000000 | 2 | 7 | — | 12 | 13 |
| 1 | 000001 | 0 | 0 | 1 | — | — |
| 2 | 000010 | 1 | — | 4 | 5 | 6 |
| 4 | 000100 | 1 | — | 7 | 8 | 9 |
| 5 | 000101 | 0 | 2 | 3 | — | — |
| 8 | 001000 | 1 | — | 11 | 14 | 15 |
| 9 | 001001 | 0 | 0 | 1 | — | — |
| 10 | 001010 | 1 | — | 10 | 12 | 13 |
| 16 | 010000 | 2 | — | — | 14 | 15 |
| 17 | 010001 | 0 | 2 | 3 | — | — |
| 18 | 010010 | 1 | — | 4 | 5 | 6 |
| 20 | 010100 | 1 | — | 9 | 10 | 11 |
| 21 | 010101 | 0 | 7 | 8 | — | — |
| 32 | 100000 | 2 | — | — | 12 | 13 |
| 33 | 100001 | 0 | 0 | 1 | — | — |
| 34 | 100010 | 1 | — | 4 | 5 | 6 |
| 37 | 100101 | 0 | 2 | 3 | — | — |
| 40 | 101000 | 1 | — | 11 | 14 | 15 |
| 41 | 101001 | 0 | 7 | 8 | — | — |
| 42 | 101010 | 1 | — | 10 | 12 | 13 |

FIG. 13

| D(k) | C(k) | DECISION INFORMATION | S(k) |
|---|---|---|---|
| 15 | 010000 | 2 | 3 |
| 0 | 001001 | 0 | 0 |
| 1 | 000001 | 0 | 1 |
| 2 | 000101 | 0 | 0 |
| 3 | 010001 | 0 | — |

MODULATION SYSTEM USING ENCODING TABLES AND METHOD THEREFOR

BACKGROUND OF THE INVENTION

1. Field of the Invention

This invention relates to a modulation method, a modulation apparatus, a demodulation method, a demodulation apparatus, an information recording medium, an information transmission method, and an information transmission apparatus.

2. Description of the Related Art

Some modulation (encoding) procedures used for digital signals recorded on recording mediums are of a (1, 7) RLL type, where "(1, 7) RLL" means run length limiting rules such that 1 to 7 successive bits of "0" should be between bits of "1" in a modulation-resultant bit stream. The (1, 7) RLL modulation tends to insufficiently suppress DC and near-DC components of a modulation-resultant bit stream. Therefore, in specified conditions, the spectrum of an information signal enters a frequency band assigned to a servo signal. In this case, the information signal interferes with servo control.

Japanese patent application publication number 6-195887/1994 discloses first and second modulation apparatuses. The first modulation apparatus in Japanese application 6-195887 processes an input signal which has a sequence of symbols each having one byte. The first modulation apparatus includes an inverting circuit, a parallel-to-serial converting circuit, and a (1, 7) RLL modulation circuit. The inverting circuit receives the input signal, and inverts all bits in every odd-numbered symbol. The inverting circuit keeps every even-numbered symbol unchanged. The output signal from the inverting circuit is converted into a first bit stream by the parallel-to-serial converting circuit. The (1, 7) RLL modulation circuit subjects the first bit stream to (1, 7) RLL modulation, thereby generating a modulation-resultant bit stream (a second bit stream). The inversion of every odd-numbered symbol by the inverting circuit causes the suppression of a DC component of the modulation-resultant bit stream.

The second modulation apparatus in Japanese application 6-195887 includes a randomizing circuit and a (1, 7) RLL modulation circuit. The randomizing circuit receives an input signal, and randomizes the input signal. The randomizing circuit outputs the randomizing-resultant signal to the (1, 7) RLL modulation circuit. The (1, 7) RLL modulation circuit subjects the randomizing-resultant signal to (1, 7) RLL modulation, thereby generating a modulation-resultant bit stream. The signal processing by the randomizing circuit causes the suppression of a DC component of the modulation-resultant bit stream.

Japanese patent application publication number 10-340543/1998 discloses (1, 7) RLL modulation provided with DSV (digital sum variation) control for suppressing DC and low-frequency components of a modulation-resultant bit stream. According to the (1, 7) RLL modulation in Japanese application 10-340543, three successive bits in every prescribed position in a (1, 7) RLL code string is replaced by six successive DSV control bits of a pattern chosen so that the rules "(1, 7) RLL" will be observed.

Japanese patent application publication number 2000-332613 discloses a 4-6 modulator. The 4-6 modulator contains a set of four different encoding tables. The 4-6 modulator converts or encodes every 4-bit input code word into a 6-bit output code word by referring to the set of the encoding tables. The 6-bit output code word forms a 6-bit block of a modulation-resultant bit stream. Each of the encoding tables stores 6-bit output code words assigned to 4-bit input code words respectively. In addition, the encoding tables contain next-table selection numbers accompanying the respective 6-bit output code words therein. Each of the next-table selection numbers designates one among the encoding tables which will be used to convert a next 4-bit input code word. The output code words and the next-table selection numbers in the encoding tables are designed so that the modulation-resultant bit stream formed by a succession of selected output code words will follow (1, 7) RLL. First and second specified ones of the encoding tables are designed so that 6-bit output code words in the first specified encoding table which correspond to prescribed 4-bit input code words will be opposite in polarity ("odd-even" in the number of "1") to those of 6-bit output code words in the second specified encoding table.

In the 4-6 modulator of Japanese application 2000-332613, two candidate 6-bit output code words may be selected from the first and second specified encoding tables in response to a given 4-bit input code word. DSVs (digital sum variations) are calculated for the candidate 6-bit output code words, respectively. The absolute values of the DSVs are compared. One of the candidate 6-bit output code words which corresponds to the smaller of the absolute values of the DSVs is selected as a final 6-bit output code word. In this way, DSV control is implemented.

Japanese application 2000-332613 further discloses a demodulation apparatus including a 6-4 demodulator. In Japanese application 2000-332613, the 6-4 demodulator recovers encoding-table designation information from a sequence of 6-bit code words. The encoding-table designation information represents which of encoding tables has been used in generating a code word immediately following a code word of interest. The 6-4 demodulator decodes the code word of interest into an original code word by referring to a decoding table in response to the recovered encoding-table designation information.

Japanese patent application publication number 11-346154/1999 discloses a modulation apparatus, a modulation method, a demodulation apparatus, a demodulation method, a providing medium related to the modulation apparatus, and a providing medium related to the demodulation apparatus. The modulation apparatus in Japanese application 11-346154 includes an inserting section which adds DSV control bits to an input data sequence. The inserting section outputs the DSV-control-bit-added data to a modulator. The modulator handles the output data from the inserting section as data having a basic data length of 2 bits. According to a conversion table, the modulator converts the output data from the inserting section into data of a variable length code having a basic data length of 3 bits. The modulator outputs the variable-length-code data to an NRZI converter. The conversion table has a replacement code for restricting succession of a minimum run to a prescribed number of times or less, and a replacement code for observing run length limiting rules. The conversion table further has a conversion rule such that the remainder in the division of the number of bits of "1" in an element of a data sequence by 2 and the remainder in the division of the number of bits of "1" in an element of a code word sequence by 2 are equal to each other as 1 or 0. Thus, the data sequence and the code word sequence are equal in polarity ("odd-even" in the number of bits of "1" in an element).

SUMMARY OF THE INVENTION

It is a first object of this invention to provide a modulation method which is excellent in encoding rate (encoding efficiency) and DC-component suppression.

It is a second object of this invention to provide a modulation apparatus which is excellent in encoding rate and DC-component suppression.

It is a third object of this invention to provide a demodulation method which is excellent in encoding rate and DC-component suppression.

It is a fourth object of this invention to provide a demodulation apparatus which is excellent in encoding rate and DC-component suppression.

It is a fifth object of this invention to provide an information recording medium which is excellent in encoding rate and DC-component suppression.

It is a sixth object of this invention to provide an information transmission method which is excellent in encoding rate and DC-component suppression.

It is a seventh object of this invention to provide an information transmission apparatus which is excellent in encoding rate and DC-component suppression.

A first aspect of this invention provides a modulation method comprising the steps of generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information; adding two redundant bits to every prescribed number of the successive generated output code words for digital-sum-variation control; and sequentially connecting the generated output code words and the added redundant bits into a redundant-bit-added output-code-word sequence which follows predetermined run length limiting rules (1, k)RLL, where "k" denotes a predetermined natural number equal to 9.

A second aspect of this invention is based on the first aspect thereof, and provides a modulation method wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising the steps of generating a first candidate current output code word in response to a current input code word equal to one of the prescribed input code words by referring to the first specified one of the encoding tables, and generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the predetermined run length limiting rules (1, k)RLL.

A third aspect of this invention is based on the second aspect thereof, and provides a modulation method further comprising the step of selecting one from the first and second candidate current output code words as a final current output code word.

A fourth aspect of this invention is based on the second aspect thereof, and provides a modulation method further comprising the steps of calculating a first CDS of the first candidate current output code word; updating a first DSV of the first candidate current output code word and previous final output code words in response to the first CDS; calculating a second CDS of the second candidate current output code word; updating a second DSV of the second candidate current output code word and previous final output code words in response to the second CDS; determining which of an absolute value of the first DSV and an absolute value of the second DSV is smaller; and selecting one from the first and second candidate current output code words which corresponds to the smaller DSV absolute value as a final current output code word.

A fifth aspect of this invention provides a modulation apparatus comprising means for generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information; means for adding two redundant bits to every prescribed number of the successive generated output code words for digital-sum-variation control; and sequentially connecting the generated output code words and the added redundant bits into a redundant-bit-added output-code-word sequence which follows predetermined run length limiting rules (1, k)RLL, where "k" denotes a predetermined natural number equal to 9.

A sixth aspect of this invention is based on the fifth aspect thereof, and provides a modulation apparatus wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising means for generating a first candidate current output code word in response to a current input code word equal to one of the prescribed input code words by referring to the first specified one of the encoding tables, and means for generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the predetermined run length limiting rules (1, k)RLL.

A seventh aspect of this invention is based on the sixth aspect thereof, and provides a modulation apparatus further comprising means for selecting one from the first and second candidate current output code words as a final current output code word.

An eighth aspect of this invention is based on the sixth aspect thereof, and provides a modulation apparatus further comprising means for calculating a first CDS of the first candidate current output code word; means for updating a first DSV of the first candidate current output code word and previous final output code words in response to the first CDS; means for calculating a second CDS of the second candidate current output code word; means for updating a second DSV of the second candidate current output code word and previous final output code words in response to the second CDS; means for determining which of an absolute value of the first DSV and an absolute value of the second DSV is smaller; and means for selecting one from the first and second candidate current output code words which corresponds to the smaller DSV absolute value as a final current output code word.

A ninth aspect of this invention provides a demodulation method of demodulating a sequence of 6-bit code words and redundant bits which is generated by the modulation method in the first aspect of this invention. The demodulation method comprises the steps of removing the redundant bits from the sequence to generate a redundant-bit-less codeword sequence; recovering encoding-table designation information from the redundant-bit-less code-word sequence, the encoding-table designation information representing which of encoding tables has been used in generating a code word immediately following a code word of interest; and demodulating the code word of interest into an original code word by referring to a decoding table in response to the recovered encoding-table designation information.

A tenth aspect of this invention provides a demodulation apparatus for demodulating a sequence of 6-bit code words and redundant bits which is generated by the modulation apparatus in the fifth aspect of this invention. The demodulation apparatus comprises means for removing the redundant bits from the sequence to generate a redundant-bit-less code-word sequence; means for recovering encoding-table designation information from the redundant-bit-less code-word sequence, the encoding-table designation information representing which of encoding tables has been used in generating a code word immediately following a code word of interest; and means for demodulating the code word of interest into an original code word by referring to a decoding table in response to the recovered encoding-table designation information.

An eleventh aspect of this invention provides an information recording medium storing a sequence of code words and redundant bits which is generated by the modulation apparatus in the fifth aspect of this invention.

A twelfth aspect of this invention provides an information transmission method of transmitting a sequence of code words and redundant bits which is generated by the modulation method in the first aspect of this invention.

A thirteenth aspect of this invention provides an information transmission apparatus for transmitting a sequence of code words and redundant bits which is generated by the modulation apparatus in the fifth aspect of this invention.

BRIEF DESCRIPTION OF THE DRAWINGS

FIG. 1 is a diagram of 6-bit output code words which follow (1, 7) RLL.

FIG. 2 is a diagram of an encoding table for converting every 4-bit input code word into a 6-bit output code word which is used in a modulation apparatus according to a first embodiment of this invention.

FIG. 5 is a diagram of an example of five successive input code words D(k), five successive current-table selection numbers S(k) for designating sub encoding tables used in encoding the input code words D(k), five successive output code words C(k) assigned to the input code words D(k), and five successive next-table selection numbers S(k+1) accompanying the output code words C(k).

FIG. 7 is a time-domain diagram of a succession of output code words C(k−1), C(k)0, and C(k+1) being "010000", "101001", and "000001", and the result of NRZI conversion of the output code words C(k−1), C(k)0, and C(k+1).

FIG. 8 is a time-domain diagram of a succession of output code words C(k−1), C(k)1, and C(k+1) being "010000", "001001", and "000001", and the result of NRZI conversion of the output code words C(k−1), C(k)1, and C(k+1).

FIG. 12 is a diagram of an example of the contents of a decoding table used in the demodulation apparatus of FIG. 11.

FIG. 13 is a diagram of a succession of input code words C(k) being "010000", "001001", "000001", "000101", and "010001", a succession of reproduced original code words D(k) corresponding to the input code words C(k), a succession of states of decision information corresponding to the input code words C(k), and a succession of encoding states S(k) corresponding to the input code words C(k).

DETAILED DESCRIPTION OF THE INVENTION

First Embodiment

Figure 3:
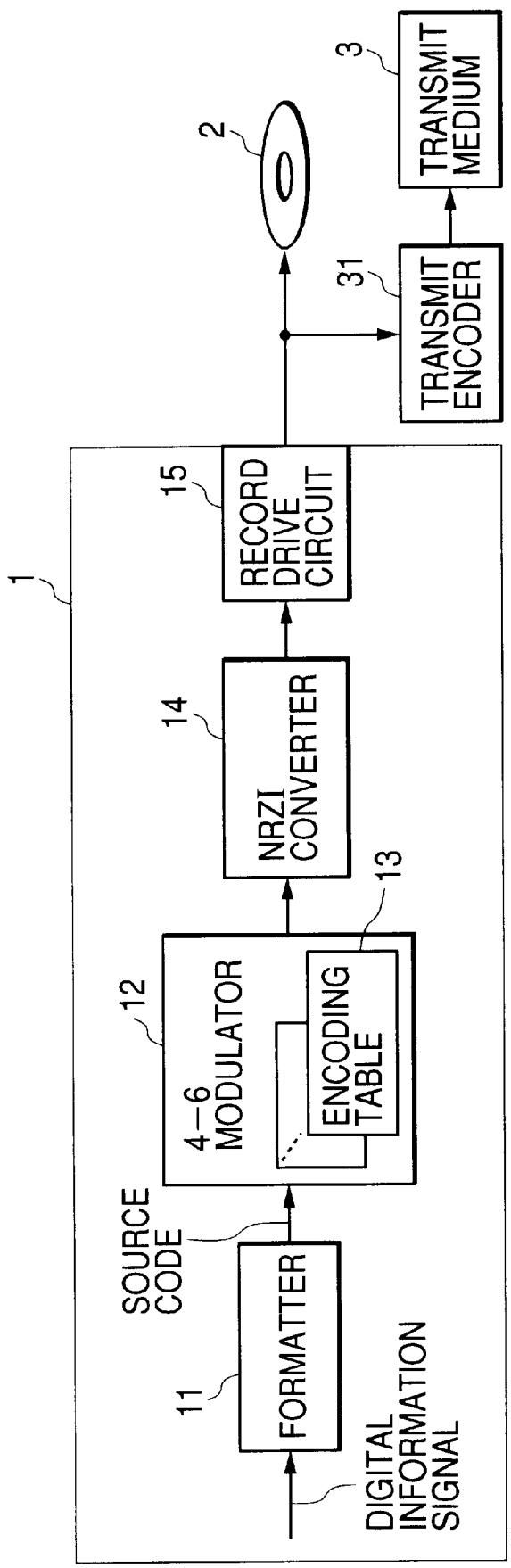
FIG. 3 is a block diagram of the modulation apparatus according to the first embodiment of this invention.

Run length limiting rules "(d, k) RLL" are such that "d" to "k" successive bits of "0" should be between bits of "1" in a modulation-resultant bit stream, where "d" and "k" denote predetermined natural numbers and the number "d" is smaller than the number "k".

FIG. 1 shows 6-bit output code words which follow (1, 7) RLL. FIG. 2 shows an encoding table for converting or encoding every 4-bit input code word (every 4-bit input data word) into a 6-bit output code word. The encoding table in FIG. 2 uses 6-bit output code words listed in FIG. 1.

The encoding table in FIG. 2 has a set of four sub encoding tables having identification (ID) numbers of "0", "1", "2", and "3" respectively. Each of the four sub encoding tables stores 6-bit output code words C(k) assigned to 4-bit input code words D(k). The four sub encoding tables contain arrays of cells at different addresses respectively. Each of the cells has a set of an input code word D(k), an output code word C(k) assigned to the input code word D(k), and a number S(k+1) assigned to the output code word C(k). In FIG. 2, each input code word D(k) is expressed by the decimal notation while each output code word C(k) is expressed by both the decimal notation and the binary notation. In FIG. 2, each output code word C(k) is followed by and accompanied with a number S(k+1) which designates a sub encoding table used next. Under normal conditions, when the number S(k+1) accompanying the current output code word is "0", the sub encoding table having an ID number of "0" is used to generate a next output code word. When the number S(k+1) accompanying the current output code word is "1", the sub encoding table having an ID number of "1" is used to generate a next output code word. When the number S(k+1) accompanying the current output code word is "2", the sub encoding table having an ID number of "2" is used to generate a next output code word. When the number S(k+1) accompanying the current output code word is "3", the sub encoding table having an ID number of "3" is used to generate a next output code word. The numbers S(k+1) are referred to as the next-table selection numbers S(k+1). The next-table selection numbers S(k+1) are designed so that a sequence of selected output code words will follow (1, 7) RLL. A next-table selection number accompanying an output code word C(k−1) immediately preceding the current output code word C(k) is defined as a current-table selection number S(k) used for generation of the current output code word C(k) in response to the current input code word D(k).

The sub encoding table having an ID number of "1" and the sub encoding table having an ID number of "2" are in a predetermined relation as follows. The NRZI modulation results (the NRZI conversion results) of output code words assigned to prescribed input code words in the sub encoding table having an ID number of "1" are opposite in polarity ("odd-even" in the number of bits of "1", that is, DSV-related polarity) to those of output code words in the sub encoding table having an ID number of "2". The opposite polarities cause a DSV (digital sum variation) in an increasing direction and a DSV in a decreasing direction, respectively. As mentioned later, in the case where the sub encoding table having an ID number of "2" is originally designated and a current input code word is identical with such a prescribed one, two output code words are read out from the sub encoding table having an ID number of "2" and the sub encoding table having an ID number of "1" as two candidate output code words respectively. In this case, one is selected from the two candidate output code words as a final output code word in response to DSV calculation results.

The sub encoding table having an ID number of "1" and the sub encoding table having an ID number of "3" are in a predetermined relation as follows. The NRZI modulation results of output code words assigned to prescribed input code words in the sub encoding table having an ID number of "1" are opposite in DSV-related polarity to those of output code words in the sub encoding table having an ID number of "3". The opposite polarities cause a DSV in an increasing direction and a DSV in a decreasing direction, respectively. As mentioned later, in the case where the sub encoding table having an ID number of "3" is originally designated and a current input code word is identical with such a prescribed one, two output code words are read out from the sub encoding table having an ID number of "3" and the sub encoding table having an ID number of "1" as two candidate output code words respectively. In this case, one is selected from the two candidate output code words as a final output code word in response to DSV calculation results.

The sub encoding table having an ID number of "0" and the sub encoding table having an ID number of "2" are in a predetermined relation as follows. The NRZI modulation results of output code words assigned to prescribed input code words in the sub encoding table having an ID number of "0" are opposite in DSV-related polarity to those of output code words in the sub encoding table having an ID number of "2". The opposite polarities cause a DSV in an increasing direction and a DSV in a decreasing direction, respectively. As mentioned later, in the case where the sub encoding table having an ID number of "2" is originally designated and a current input code word is identical with such a prescribed one, two output code words are read out from the sub encoding table having an ID number of "2" and the sub encoding table having an ID number of "0" as two candidate output code words respectively. In this case, one is selected from the two candidate output code words as a final output code word in response to DSV calculation results.

In the four sub encoding tables of FIG. 2, each of some output code words is assigned in common to a plurality of input code words, and the common output code words in the respective cells are accompanied with different next-table selection numbers S(k+1) respectively. This design is advantageous in reducing the volume of the encoding table. The assignment of next-table selection numbers S(k+1) to output code words follows predetermined rules. Next-table selection numbers S(k+1) accompanying transmitted output code words are not positively transmitted to a decoder side (a demodulation side). The decoder side utilizes the predetermined assignment rules, and thereby recovers a next-table selection number S(k+1) accompanying a code word of interest and then uses the recovered next-table selection number S(k+1) in decoding the code word of interest rather than decoding a code word immediately following the code word of interest. This design simplifies the decoding procedure.

An encoding table which is similar to the encoding table in FIG. 2 except for assignment of output code words C(k) to input code words D(k) may be used instead of the encoding table in FIG. 2 as long as the required encoding rules can be observed.

The encoding table in FIG. 2 is designed for conversion of a 4-bit input code word into a 6-bit output code word. Since doubling a 4-bit input code word and a 6-bit output code word results in an 8-bit input code word and a 12-bit output code word, an encoding table for converting an 8-bit input code word into a 12-bit output code word can be made on the basis of the encoding table in FIG. 2. Accordingly, this invention contains 8-12 modulation in addition to 4-6 modulation.

FIG. 3 shows a modulation apparatus 1 according to a first embodiment of this invention. As shown in FIG. 3, the modulation apparatus 1 includes a formatter 11, a 4-6 modulator 12, an NRZI (non-return-to-zero invert) converter 14, and a recording and driving circuit 15 which are sequentially connected in that order.

The formatter 11 receives a digital information signal also referred to as an input digital signal. The input digital signal represents information such as video information, audio information, or audio visual information. The formatter 11 adds an error correction code signal to the received digital information signal, and sectors and makes the addition-resultant signal into a second digital signal of a predetermined control format conforming with a recording format used by a recording medium 2. The formatter 11 outputs the second digital signal to the 4-6 modulator 12. The second digital signal is also referred to as the source code signal. The source code signal has a sequence of 4-bit input code words.

The 4-6 modulator 12 includes an encoding table 13 using the encoding table in FIG. 2. The 4-6 modulator 12 subjects the second digital signal (the source code signal) to 4-6 modulation by referring to the encoding table 13. Thereby, the 4-6 modulator 12 converts the second digital signal into a third digital signal. In addition, the 4-6 modulator 12 adds a sync word to the third digital signal for every frame (sync frame). A given number of sync frames compose one recording sector. Furthermore, the 4-6 modulator 12 periodically inserts a redundant bit pattern to the third digital signal. The 4-6 modulator 12 outputs the resultant third digital signal to the NRZI converter 14.

The NRZI converter 14 subjects the third digital signal (the output digital signal from the 4-6 modulator 12) to NRZI modulation, thereby converting the third digital signal into a fourth digital signal which is of an NRZI code. The NRZI converter 14 outputs the fourth digital signal to the recording and driving circuit 15. The recording and driving circuit 15 records the fourth digital signal (the output digital signal from the NRZI converter 14) on a recording medium 2 via a recording head.

The fourth digital signal can be fed to a transmission encoder 31 from the recording and driving circuit 15. The device 31 encodes the fourth digital signal into a fifth digital signal which is of a code suited for transmission. The transmission encoder 31 outputs the fifth digital signal to a transmission medium 3. The fifth digital signal propagates along the transmission medium 3.

Figure 4:
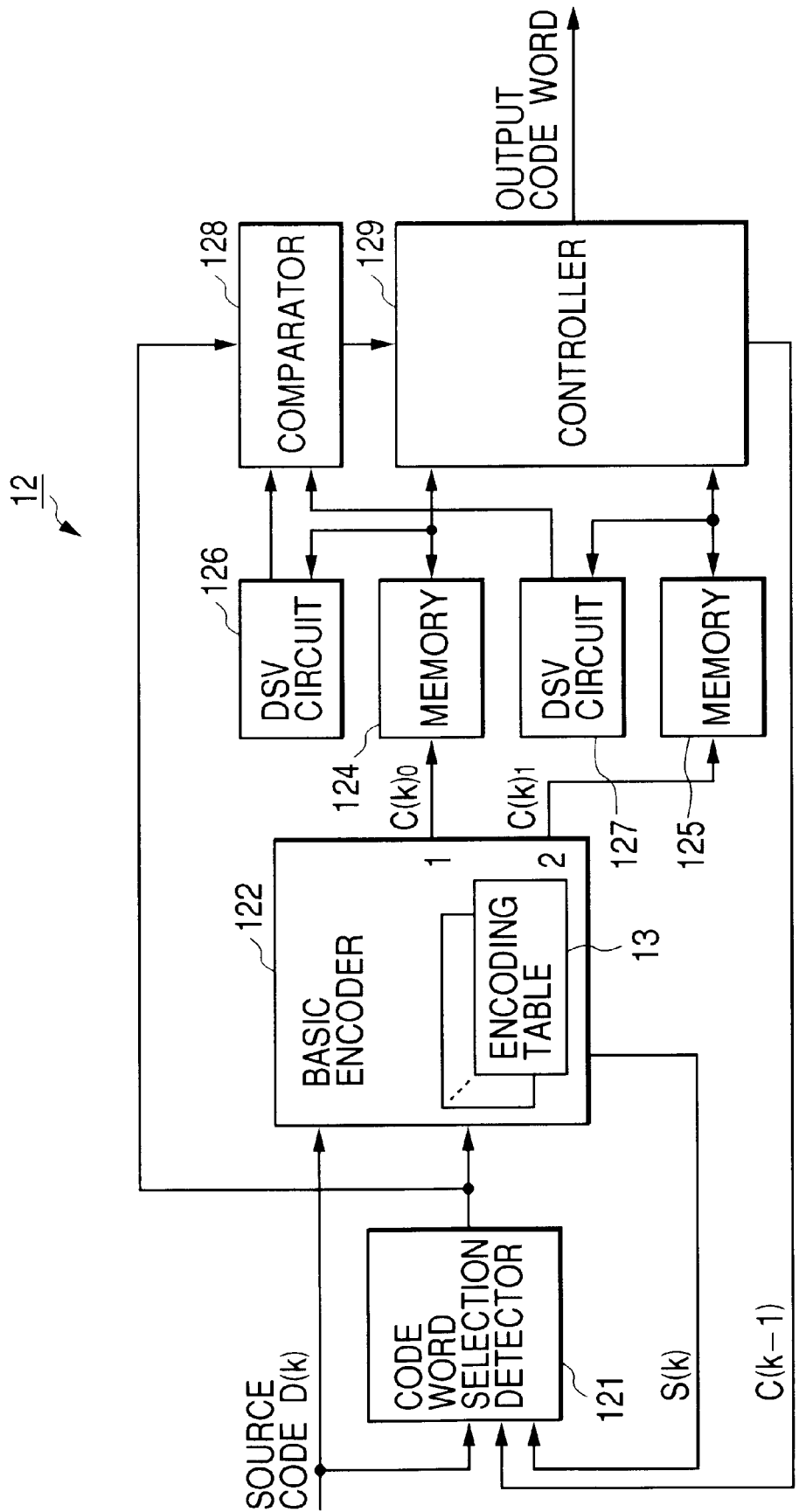
FIG. 4 is a block diagram of a 4-6 modulator in FIG. 3.

As shown in FIG. 4, the 4-6 modulator 12 includes two memories 124 and 125 in paths "0" and "1" respectively. The path memories 124 and 125 are also referred to as the code word memories. The 4-6 modulator 12 further includes a code-word selection detector 121 and a basic encoder 122. The code-word selection detector 121 is connected with the basic encoder 122. The basic encoder 122 is connected with the path memories 124 and 125.

The basic encoder 122 receives the source code signal from the formatter 11. The basic encoder 122 handles every 4-bit block of the source code signal as an input code word. The basic encoder 122 includes the encoding table 13 used for converting or encoding every 4-bit input code word into a 6-bit output code word. The basic encoder 122 also includes an address generator for producing an address signal in response to every 4-bit input code word. The address signal designates one of the cells in the encoding table 13 which should be accessed.

The 4-6 modulator 12 further includes DSV circuits 126 and 127, a comparator 128, and a controller 129. The DSV circuit 126 is connected with the path memory 124, the comparator 128, and the controller 129. The DSV circuit 127 is connected with the path memory 125, the comparator 128, and the controller 129. The comparator 128 is connected with the code-word selection detector 121 and the controller 129. The controller 129 is connected with the path memories 124 and 125. The controller 129 is followed by the NRZI converter 14 (see FIG. 3).

The 4-6 modulator 12 operates as follows. The basic encoder 122 receives the source code signal from the formatter 11. The basic encoder 122 handles every 4-bit block of the source code signal as an input code word D(k). In addition, the basic encoder 122 implements frame-by-frame signal processing. Here, "frame" means a sync frame corresponding to each prescribed segment of the source code signal. A given number of sync frames compose one recording sector. The basic encoder 122 has an initial table in addition to the encoding table 13. The initial table contains a predetermined sync word (a predetermined sync bit pattern) and a predetermined initial value of an adopted next-table selection number S(k+1). During a start of every frame, the basic encoder 122 accesses the initial table, and reads out the sync word and the initial value therefrom. The basic encoder 122 outputs the read-out sync word to the next stage, that is, the path memories 124 and 125. The basic encoder 122 stores the read-out sync word into the path memories 124 and 125. The basic encoder 122 sets the adopted next-table selection number S(k+1) to the read-out initial value. The basic encoder 122 delays a signal representative of the adopted next-table selection number S(k+1) by a time interval corresponding to one word, thereby generating a signal representative of a current-table selection number S(k). First, the current-table selection number S(k) is equal to the initial value. Thereafter, the current-table selection number S(k) is equal to a next-table selection number accompanying an immediately-previous output code word C(k−1). The basic encoder 122 outputs the signal of the current-table selection number S(k) to the code-word selection detector 121.

The code-word selection detector 121 receives the source code signal from the formatter 11. The code-word selection detector 121 handles every 4-bit block of the source code signal as a current input code word D(k). The code-word selection detector 121 receives the signal of the current-table selection number S(k) from the basic encoder 122. First, the current-table section number S(k) is equal to the initial value. In addition, the code-word selection detector 121 is informed by the controller 129 of a latest output code word C(k−1) which has been finally selected and decided. The code-word selection detector 121 detects whether or not an output code word corresponding to the current input code word D(k) is uniquely decided, that is, whether or not selecting one from candidate output code words as a final output code word corresponding to the current input code word D(k) is required on the basis of the current input code word D(k), the current-table selection number S(k), the latest selected output code word C(k−1), and the MSB of an output code word C(k+1). The code-word selection detector 121 outputs a signal representative of a result of the detection to the basic encoder 122 and the comparator 128. In more detail, the code-word selection detector 121 decides whether or not the current input code word D(k), the current-table selection number S(k), the latest selected output code word C(k−1), and the MSB of the output code word C(k+1) are in prescribed conditions. When the current input code word D(k), the current-table selection number S(k), the latest selected output code word C(k−1), and the MSB of the output code word C(k+1) are in the prescribed conditions, the code-word selection detector 121 outputs a detection-result signal (a code-word selection signal) indicating that code-word selection is required. Otherwise, the code-word selection detector 121 outputs a detection-result signal (a code-word non-selection signal) indicating that code-word selection is not required.

In the case where the detection-result signal outputted from the code-word selection detector 121 indicates that code-word selection is required, the basic encoder 122 takes two candidate output code words C(k)0 and C(k)1 for the current input code word D(k). Specifically, the basic encoder 122 generates two different addresses in response to the current input code word D(k) and the current-table selection number S(k), and accesses two of the four sub encoding tables in response to the generated addresses. One of the two accessed sub encoding tables has an ID number equal to the current-table selection number S(k). The basic encoder 122 reads out an output code word C(k)0 assigned to the current input code word D(k) from the sub encoding table having an ID number equal to the current-table selection number S(k). The read-out output code word C(k)0 is defined as the first candidate output code word C(k)0. The basic encoder 122 reads out an output code word C(k)1 assigned to the current input code word D(k) from the other accessed sub encoding table. The read-out output code word C(k)1 is defined as the second candidate output code word C(k)1. The candidate output code words C(k)0 and C(k)1 are assigned to the path "0" and the path "1", respectively. The basic encoder 122 stores the candidate output code words C(k)0 and C(k)1 into the path memories 124 and 125, respectively.

In the case where the detection-result signal outputted from the code-word selection detector 121 indicates that code-word selection is not required, the basic encoder 122 takes only one output code word C(k) for the current input code word D(k). Specifically, the basic encoder 122 generates only one address in response to the current input code word D(k) and the current-table selection number S(k), and accesses one of the four sub encoding tables in response to the generated address. The accessed sub encoding table has an ID number equal to the current-table selection number S(k). The basic encoder 122 reads out an output code word C(k) assigned to the current input code word D(k) from the sub encoding table having an ID number equal to the current-table selection number S(k). The basic encoder 122 stores the output code word C(k) into the path memory 124 as a first candidate output code word C(k)0. The basic encoder 122 stores the output code word C(k) into the path memory 125 as a second candidate output code word C(k)1. In this way, the same output code word C(k) is written into the path memories 124 and 125. The basic encoder 122 updates the adopted next-table selection number S(k+1) to the value accompanying the output code word C(k).

The DSV circuit 126 calculates a CDS (code digital sum) value of the output code word C(k)0 in the path memory 124, and updates a DSV value of the output code word C(k)0 and previous output code words in response to the calculated CDS value. The DSV circuit 126 has a memory loaded with a signal representative of the updating-resultant DSV value (the newest DSV value). The DSV value provided by the DSV circuit 126 relates to the path "0". Similarly, the DSV circuit 127 calculates a CDS (code digital sum) value of the output code word C(k)1 in the path memory 125, and updates a DSV value of the output code word C(k) and previous output code words in response to the calculated CDS value. The DSV circuit 127 has a memory loaded with a signal representative of the updating-resultant DSV value (the newest DSV value). The DSV value provided by the DSV circuit 127 relates to the path "1".

The comparator 128 responds to the detection-result signal outputted from the code-word selection detector 121. In the case where the detection-result signal indicates that code-word selection is required, the comparator 128 accesses the memories within the DSV circuits 126 and 127. The comparator 128 calculates the absolute newest DSV value (the first absolute DSV value) stored in the memory within the DSV circuit 126. The comparator 128 calculates the absolute newest DSV value (the second absolute DSV value) stored in the memory within the DSV circuit 127. The device 128 compares the first and second absolute DSV values to decide which of the two is smaller. The comparator 128 notifies the result of the comparison to the controller 129. In the case where the detection-result signal indicates that code-word selection is not required, the comparator 128 is inactive and does not notify any comparison result to the controller 129.

When the comparison result notified by the comparator 128 indicates that the first absolute DSV value is smaller than the second absolute DSV value, the controller 129 reads out the output code word C(k)0 from the path memory 124. The controller 129 transmits the read-out output code word C(k)0 to the NRZI converter 14 as a finally-selected output code word. The controller 129 informs the code-word selection detector 121 of the read-out output code word as the latest selected output code word C(k−1). In addition, the controller 129 replaces the contents of the output code word C(k)1 in the path memory 125 with the contents of the output code word C(k)0. Thus, in this case, the contents of the output code word C(k)1 in the path memory 125 are updated to the contents of the output code word C(k)0 in the path memory 124. Furthermore, the controller 129 reads out the DSV value from the memory within the DSV circuit 126, and updates the DSV value in the memory within the DSV circuit 127 to the read-out DSV value. Thus, in this case, the DSV value in the memory within the DSV circuit 127 is set to the DSV value in the memory within the DSV circuit 126. In addition, the controller 129 informs the basic encoder 122 that the output code word C(k)0 has been selected. The basic encoder 122 updates the adopted next-table selection number S(k+1) to the value accompanying the output code word C(k)0.

When the comparison result notified by the comparator 128 indicates that the first absolute DSV value is equal to or greater than the second absolute DSV value, the controller 129 reads out the output code word C(k)1 from the path memory 125. The controller 129 transmits the read-out output code word C(k)1 to the NRZI converter 14 as a finally-selected output code word. The controller 129 informs the code-word selection detector 121 of the read-out output code word as the latest selected output code word C(k−1). In addition, the controller 129 replaces the contents of the output code word C(k)0 in the path memory 124 with the contents of the output code word C(k)1. Thus, in this case, the contents of the output code word C(k)0 in the path memory 124 are updated to the contents of the output code word C(k)1 in the path memory 125. Furthermore, the controller 129 reads out the DSV value from the memory within the DSV circuit 127, and updates the DSV value in the memory within the DSV circuit 126 to the read-out DSV value. Thus, in this case, the DSV value in the memory within the DSV circuit 126 is set to the DSV value in the memory within the DSV circuit 127. In addition, the controller 129 informs the basic encoder 122 that the output code word C(k)1 has been selected. The basic encoder 122 updates the adopted next-table selection number S(k+1) to the value accompanying the output code word C(k)1.

In this way, one corresponding to the smaller absolute DSV value is selected from the candidate output code words C(k)0 and C(k)1 as a final output code word. Therefore, DSV control is implemented.

In the absence of the comparison result notified by the comparator 128, the controller 129 reads out the output code word C(k)0 from the path memory 124. The controller 129 transmits the read-out output code word C(k)0 to the NRZI converter 14 as a finally-selected output code word. The controller 129 informs the code-word selection detector 121 of the read-out output code word as the latest selected output code word C(k−1). In this case, the controller 129 does not access the path memory 125 and the DSV circuits 126 and 127.

It should be noted that the number of candidate output code words may be three or more. In this case, one of the candidate output code words which corresponds to the smallest DSV value is selected as a final output code word. First and second sequences of output code words corresponding to all input code words may be stored in the path memories 124 and 125. In this case, after an end input code word has been modulated, the controller 129 selects one from the first and second sequences of output code words in the path memories 124 and 125 and transmits the selected sequence to the NRZI converter 14.

FIG. 5 shows an example of five successive input code words. With reference to FIG. 5, there is a sequence of input code words of "4", "5", "6", "7", and "8" (decimal). According to the modulation using (1, 7) RLL, the sequence of input code words is encoded into a sequence of output code words as follows. At an initial stage, the current-table selection number S(k) is set to an initial value of, for example, "0". Thus, the sub encoding table having an ID number of "0" is accessed for the first input code word "4", and an output code word of "18" (decimal) equal to "010010" (binary) which is assigned to the first input code word "4" is read out from the accessed sub encoding table (see FIG. 2). The bit sequence "010010" is outputted. At the same time, a number S(k+1) of "1" which accompanies the output code word "010010" is read out from the accessed sub encoding table. Then, the current-table selection number S(k) is updated to the read-out value "1". Thus, the sub encoding table having an ID number of "1" is accessed for the second input code word "5", and an output code word of "2" (decimal) equal to "000010" (binary) which is assigned to the second input code word "5" is read out from the accessed sub encoding table (see FIG. 2). The bit sequence "000010" is outputted. At the same time, a number S(k+1) of "2" which accompanies the output code word "000010" is read out from the accessed sub encoding table. Then, the current-table selection number S(k) is updated to the read-out value "2". Thus, the sub encoding table having an ID number of "2" is accessed for the third input code word "6", and an output code word of "18" (decimal) equal to "010010" (binary) which is assigned to the third input code word "6" is read out from the accessed sub encoding table (see FIG. 2). The bit sequence "010010" is outputted. At the same time, a number S(k+1) of "3" which accompanies the output code word "000010" is read out from the accessed sub encoding table. Then, the current-table selection number S(k) is updated to the read-out value "3". Thus, the sub encoding table having an ID number of "3" is accessed for the fourth input code word "7", and an output code word of "21" (decimal) equal to "010101" (binary) which is assigned to the fourth input code word "7" is read out from the accessed sub encoding table (see FIG. 2). The bit sequence "010101" is outputted. At the same time, a number S(k+1) of "0" which accompanies the output code word "010101" is read out from the accessed sub encoding table. Then, the current-table selection number S(k) is updated to the read-out value "0". Thus, the sub encoding table having an ID number of "0" is accessed for the fifth input code word "8", and an output code word of "21" (decimal) equal to "010101" (binary) which is assigned to the fifth input code word "8" is read out from the accessed sub encoding table (see FIG. 2). The bit sequence "010101" is outputted. At the same time, a number S(k+1) of "1" which accompanies the output code word "010101" is read out from the accessed sub encoding table. Then, the current-table selection number S(k) is updated to the read-out value "1".

In this way, a sequence of input code words of "4", "5", "6", "7", and "8" is converted into a sequence of output code words as "010010", "000010", "010010", "010101", and "010101". A bit stream formed by sequentially direct connection of the output code words is "010010000010010010010101010101". This bit stream follows (1, 7) RLL.

The code-word selection detector 121 may be formed by a digital signal processor, a CPU, or a similar device including a combination of an input/output port, a processing section, a ROM, and a RAM. In this case, the code-word selection detector 121 operates in accordance with a control program stored in the ROM.

Figure 6:
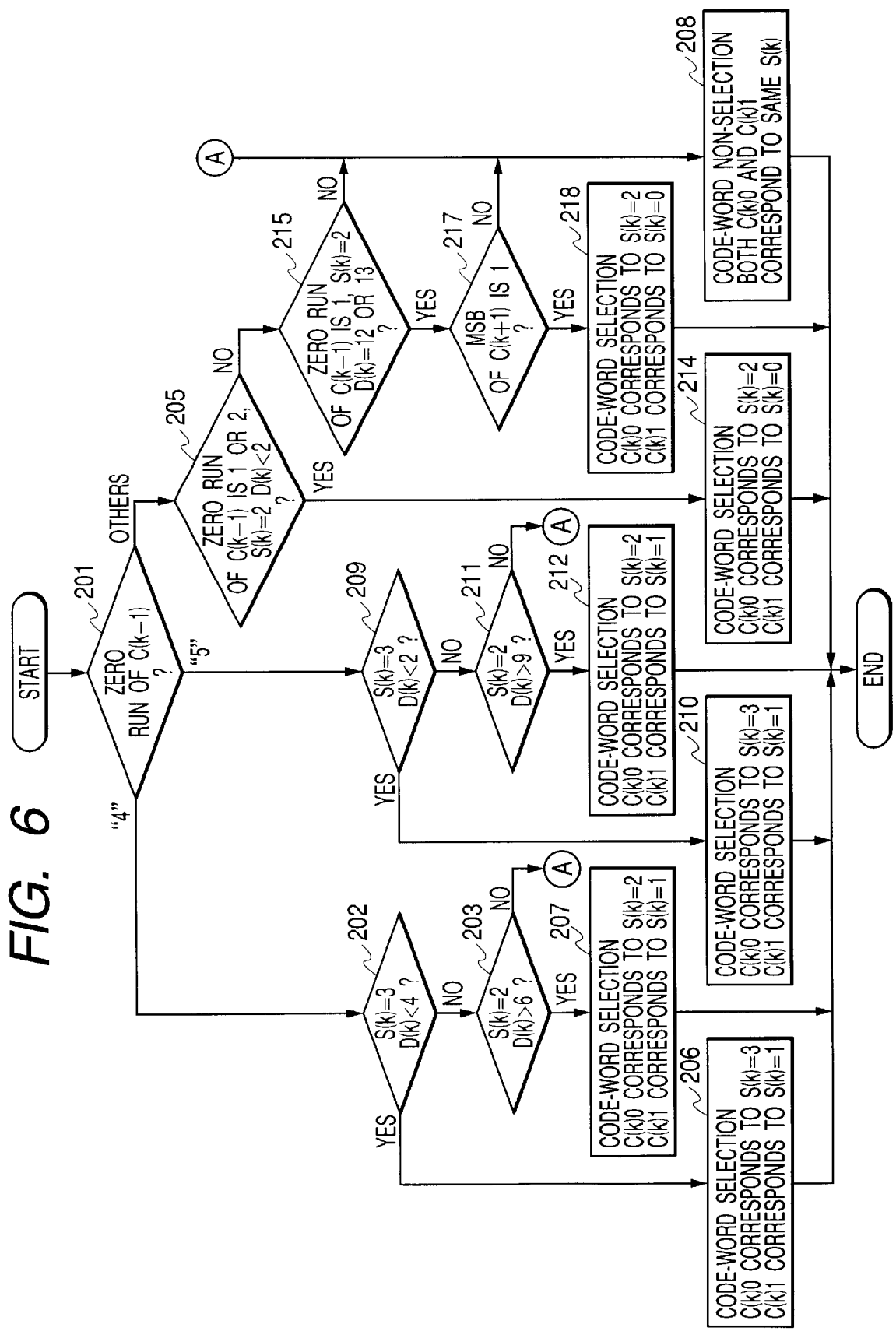
FIG. 6 is a flowchart of a segment of a control program for a code-word selection detector in FIG. 4.

FIG. 6 is a flowchart of a segment of the control program for the code-word selection detector 121 which is executed for every input code word. The program segment in FIG. 6 is designed for (1, 7) RLL. With reference to FIG. 6, a first step 201 of the program segment detects the zero run length of the LSB side of the latest selected output code word C(k−1). The latest selected output code word C(k−1) is fed from the controller 129. The step 201 decides which of predetermined values the detected LSB-side zero run length of the latest selected output code word C(k−1) is equal to. When the detected LSB-side zero run length of the latest selected output code word C(k−1) is equal to "4", that is, when the latest selected output code word C(k−1) is "010000", the program advances from the step 201 to a step 202. When the detected LSB-side zero run length of the latest selected output code word C(k−1) is equal to "5", that is, when the latest selected output code word C(k−1) is "100000", the program advances from the step 201 to a step 209. When the detected LSB-side zero run length of the latest selected output code word C(k−1) is equal to neither "4" nor "5", the program advances from the step 201 to a step 205.

The step 202 checks the current input code word D(k) and the current-table selection number S(k). The current-table selection number S(k) is notified by the basic encoder 122. The step 202 decides whether or not the current-table selection number S(k) is "3" and the current input code word D(k) is less than "4" (decimal). In other words, the step 202 decides whether or not the current-table selection number S(k) is "3" and the current input code word D(k) is in the range of "0" to "3" (decimal). When the current-table selection number S(k) is "3" and the current input code word D(k) is in the range of "0" to "3", the program advances from the step 202 to a step 206. Otherwise, the program advances from the step 202 to a step 203.

The step 203 decides whether or not the current-table selection number S(k) is "2" and the current input code word D(k) is greater than "6" (decimal). When the current table-table selection number S(k) is "2" and the current input code word D(k) is greater than "6", the program advances from the step 203 to a step 207. Otherwise, the program advances from the step 202 to a step 208.

The step 209 checks the current input code word D(k) and the current-table selection number S(k). The step 209 decides whether or not the current-table selection number S(k) is "3" and the current input code word D(k) is less than "2" (decimal). In other words, the step 209 decides whether or not the current-table selection number S(k) is "3" and the current input code word D(k) is in the range of "0" to "1" (decimal). When the current-table selection number S(k) is "3" and the current input code word D(k) is in the range of "0" to "1", the program advances from the step 209 to a step 210. Otherwise, the program advances from the step 209 to a step 211.

The step 211 decides whether or not the current-table selection number S(k) is "2" and the current input code word D(k) is greater than "9" (decimal). When the current-table selection number S(k) is "2" and the current input code word D(k) is greater than "9", the program advances from the step 211 to a step 212. Otherwise, the program advances from the step 211 to the step 208.

The step 205 detects the zero run length of the LSB side of the latest selected output code word C(k−1). The step 205 checks the current input code word D(k) and the current-table selection number S(k). The step 205 decides whether or not all the following conditions A1, A2, and A3 are satisfied. A1: The detected LSB-side zero run length of the latest selected output code word C(k−1) is equal to "1" or "2". In other words, the latest selected output code word C(k−1) is "010100", "000100", "100100", "010010", "000010", "001010", "101010", or "100010". A2: The current-table selection number S(k) is "2". A3: The current input code word D(k) is less than "2" (decimal). In other words, the current input code word D(k) is in the range of "0" to "1" (decimal). When all the conditions A1, A2, and A3 are satisfied, the program advances from the step 205 to a step 214. Otherwise, the program advances from the step 205 to a step 215.

The step 215 detects the zero run length of the LSB side of the latest selected output code word C(k−1). The step 215 checks the current input code word D(k) and the current-table selection number S(k). The step 215 decides whether or not all the following conditions B1, B2, and B3 are satisfied. B1: The detected LSB-side zero run length of the latest selected output code word C(k−1) is equal to "1". In other words, the latest selected output code word C(k−1) is "010010", "000010", "001010", "101010", or "100010". B2: The current-table selection number S(k) is "2". B3: The current input code word D(k) is in the range of "12" to "13" (decimal). When all the conditions B1, B2, and B3 are satisfied, the program advances from the step 215 to a step 217. Otherwise, the program advances from the step 215 to the step 208.

The step 217 determines an output code word C(k+1) assigned to a next input code word D(k+1), that is, an input code word D(k+1) immediately following the current input code word D(k). Specifically, the step 217 reads the next input code word D(k+1). The step 217 determines an output code word C(k) immediately following the latest selected output code word C(k−1) in response to the current input code word D(k) by referring to the sub encoding table in the basic encoder 122 which has an ID number of "0" or "2". The step 217 reads out a next-table selection number S(k+1) accompanying the determined output code word C(k) from the accessed sub encoding table. The step 217 reads out an output code word C(k+1) assigned to the next input code word D(k+1) from the sub encoding table having an ID number equal to the read-out next-table selection number S(k+1). Thereafter, the step 217 decides whether or not the MSB of the read-out output code word C(k+1) is "1". When the MSB of the read-out output code word C(k+1) is "1", the program advances from the step 217 to a step 218. Otherwise, the program advances from the step 217 to the step 208.

The step 206 generates a code-word selection signal designed for using the sub encoding table in the basic encoder 122 which has an ID number of "3" to generate a first candidate output code word C(k)0, and for using the sub encoding table in the basic encoder 122 which has an ID number of "1" to generate a second candidate output code word C(k)1. The step 206 outputs the generated code-word selection signal. After the step 206, the current execution cycle of the program segment ends.

The step 207 generates a code-word selection signal designed for using the sub encoding table in the basic encoder 122 which has an ID number of "2" to generate a first candidate output code word C(k)0, and for using the sub encoding table in the basic encoder 122 which has an ID number of "1" to generate a second candidate output code word C(k)1. The step 207 outputs the generated code-word selection signal. After the step 207, the current execution cycle of the program segment ends.

The step 210 generates a code-word selection signal designed for using the sub encoding table in the basic encoder 122 which has an ID number of "3" to generate a first candidate output code word C(k)0, and for using the sub encoding table in the basic encoder 122 which has an ID number of "1" to generate a second candidate output code word C(k)1. The step 210 outputs the generated code-word selection signal. After the step 210, the current execution cycle of the program segment ends.

The step 212 generates a code-word selection signal designed for using the sub encoding table in the basic encoder 122 which has an ID number of "2" to generate a first candidate output code word C(k)0, and for using the sub encoding table in the basic encoder 122 which has an ID number of "1" to generate a second candidate output code word C(k)1. The step 212 outputs the generated code-word selection signal. After the step 212, the current execution cycle of the program segment ends.

The step 214 generates a code-word selection signal designed for using the sub encoding table in the basic encoder 122 which has an ID number of "2" to generate a first candidate output code word C(k)0, and for using the sub encoding table in the basic encoder 122 which has an ID number of "0" to generate a second candidate output code word C(k)1. The step 214 outputs the generated code-word selection signal. After the step 214, the current execution cycle of the program segment ends.

The step 218 generates a code-word selection signal for using the sub encoding table in the basic encoder 122 which has an ID number of "2" to generate a first candidate output code word C(k)0, and for using the sub encoding table in the basic encoder 122 which has an ID number of "0" to generate a second candidate output code word C(k)1. The step 218 outputs the generated code-word selection signal. After the step 218, the current execution cycle of the program segment ends.

The step 208 generates a code-word non-selection signal. The step 208 outputs the generated code-word non-selection signal. After the step 208, the current execution cycle of the program segment ends.

In the case where the latest selected output code word C(k−1) is "010000" and the current-table selection number S(k) is "3", and where the current input code word D(k) is in the range of "0" to "3" (decimal), when the originally-designated sub encoding table having an ID number of "3" is used to generate an output code word C(k), a resultant succession of the output code words C(k−1) and C(k) follows (1, 7) RLL. In this case, even when the sub encoding table having an ID number of "1" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "2" or "3" will be used to generate an output code word C(k) immediately following the output code word C(k−1) being "010000". In the sub encoding tables having ID numbers of "1", "2", and "3", output code words assigned to a same input code word are different from each other. Therefore, using the sub encoding table having an ID number of "1" instead of the originally-designated sub encoding table will not cause a problem in a decoding side. This case corresponds to the combination of the steps 201, 202, and 206.

In the case where the latest selected output code word C(k−1) is "010000" and the current-table selection number S(k) is "2", and where the current input code word D(k) is greater than "6" (decimal), when the originally-designated sub encoding table having an ID number of "2" is used to generate an output code word C(k), a resultant succession of the output code words C(k−1) and C(k) follows (1, 7) RLL. In this case, even when the sub encoding table having an ID number of "1" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "2" or "3" will be used to generate an output code word C(k) immediately following the output code word C(k−1) being "010000". In the sub encoding tables having ID numbers of "1", "2", and "3", output code words assigned to a same input code word are different from each other. Therefore, using the sub encoding table having an ID number of "1" instead of the originally-designated sub encoding table will not cause a problem in a decoding side. This case corresponds to the combination of the steps 201, 203, and 207.

In the case where the latest selected output code word C(k−1) is "100000" and the current-table selection number S(k) is "3", and where the current input code word D(k) is in the range of "0" to "1" (decimal), when the originally-designated sub encoding table having an ID number of "3" is used to generate an output code word C(k), a resultant succession of the output code words C(k−1) and C(k) follows (1, 7) RLL. In this case, even when the sub encoding table having an ID number of "1" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "2" or "3" will be used to generate an output code word C(k) immediately following the output code word C(k−1) being "100000". In the sub encoding tables having ID numbers of "1", "2", and "3", output code words assigned to a same input code word are different from each other. Therefore, using the sub encoding table having an ID number of "1" instead of the originally-designated sub encoding table will not cause a problem in a decoding side. This case corresponds to the combination of the steps 201, 209, and 210.

In the case where the latest selected output code word C(k−1) is "100000" and the current-table selection number S(k) is "2", and where the current input code word D(k) is greater than "9" (decimal), when the originally-designated sub encoding table having an ID number of "2" is used to generate an output code word C(k), a resultant succession of the output code words C(k−1) and C(k) follows (1, 7) RLL. In this case, even when the sub encoding table having an ID number of "1" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "2" or "3" will be used to generate an output code word C(k) immediately following the output code word C(k−1) being "100000". In the sub encoding tables having ID numbers of "1", "2", and "3", output code words assigned to a same input code word are different from each other. Therefore, using the sub encoding table having an ID number of "1" instead of the originally-designated sub encoding table will not cause a problem in a decoding side. This case corresponds to the combination of the steps 201, 211, and 212.

In the case where the latest selected output code word C(k−1) has an LSB-side zero run length of "1" or "2" and the current-table selection number S(k) is "2", and where the current input code word D(k) is less than "2" (decimal), when the originally-designated sub encoding table having an ID number of "2" is used to generate an output code word C(k), a resultant succession of the output code words C(k−1) and C(k) follows (1, 7) RLL. In this case, even when the sub encoding table having an ID number of "0" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "1", "2", or "3" will be used to generate an output code word C(k) immediately following the output code word C(k−1) having an LSB-side zero run length of "1" or "2". In the sub encoding tables having ID numbers of "0", "1", "2", and "3", output code words assigned to a same input code word of "0" or "1" (decimal) are different from each other. Therefore, using the sub encoding table having an ID number of "0" instead of the originally-designated sub encoding table will not cause a problem in a decoding side. This case corresponds to the combination of the steps 205 and 214.

In the case where the latest selected output code word C(k−1) has an LSB-side zero run length of "1" and the current-table selection number S(k) is "2", and where the current input code word D(k) is "12" or "13" (decimal) and the MSB of the estimated output code word C(k+1) is "1", when the originally-designated sub encoding table having an ID number of "2" is used to generate an output code word C(k), a resultant succession of the output code words C(k−1) and C(k) follows (1, 7) RLL. In this case, even when the sub encoding table having an ID number of "0" is used to generate an output code word C(k) instead of the originally-designated sub encoding table, a resultant succession of the output code words C(k−1) and C(k) follows (1, 7) RLL. The encoding table 13 in FIG. 2 shows that the sub encoding table having an ID number of "1", "2", or "3" will be used to generate an output code word C(k) immediately following the output code word C(k−1) having an LSB-side zero run length of "1". In the sub encoding tables having ID numbers of "0", "1", "2", and "3", output code words assigned to a same input code word of "12" or "13" (decimal) are different from each other. Therefore, using the sub encoding table having an ID number of "0" instead of the originally-designated sub encoding table will not cause a problem in a decoding side. This case corresponds to the combination of the steps 215, 217, and 218.

DSV control is implemented as follows. In the case where the latest selected output code word C(k−1) is "010000" and the current-table selection number S(k) is "3", and where the current input code word D(k) is "0" (decimal), the originally-designated sub encoding table having an ID number of "3" and also the sub encoding table having an ID number of "1" are accessed. Output code words assigned to the current input code word D(k) are read out from the accessed sub encoding tables. The output code word read out from the sub coding table having an ID number of "3" is set as a first candidate output code word C(k)0. The output code word read out from the sub coding table having an ID number of "1" is set as a second candidate output code word C(k)1. The first candidate output code word C(k)0 is "101001" while the second candidate output code word C(k)1 is "001001". It is assumed that a next output code word C(k+1) is "000001". FIG. 7 shows a succession of the output code words C(k−1), C(k)0, and C(k+1), that is, "010000", "101001", and "000001". FIG. 7 also shows the result of NRZI conversion of the output code words C(k−1), C(k)0, and C(k+1). FIG. 8 shows a succession of the output code words C(k−1), C(k)1, and C(k+1), that is, "010000", "001001", and "000001". FIG. 8 also shows the result of NRZI conversion of the output code words C(k−1), C(k)1, and C(k+1). As shown in FIG. 7, the result of NRZI conversion of the first candidate output code word C(k)0 is "111000". As shown in FIG. 8, the result of NRZI conversion of the second candidate output code word C(k)1 is "001111". Therefore, the first and second candidate output code words C(k)0 and C(k)1 cause different DSV-related polarities regarding the NRZI conversion results respectively. Thus, the first and second candidate output code words C(k)0 and C(k)1 cause different DSV values respectively. As previously mentioned, one of the first and second candidate output code words C(k)0 and C(k)1 which causes the smaller DSV value is selected as a final output code word C(k). The code-word selection provides DSV control of suppressing a DC component of a modulation-resultant bit stream.

Also, DSV control is implemented on the basis of the insertion of redundant bit patterns into the output-code-word sequence as will be mentioned hereafter. The 4-6 modulator 12 adds a sync word to the modulation-resultant digital signal for every frame (sync frame). Furthermore, the 4-6 modulator 12 periodically inserts a redundant bit pattern into the modulation-resultant digital signal. The inserted redundant bit pattern is composed of two successive bits. The inserted redundant bit pattern can change among three different states.

Figure 9:
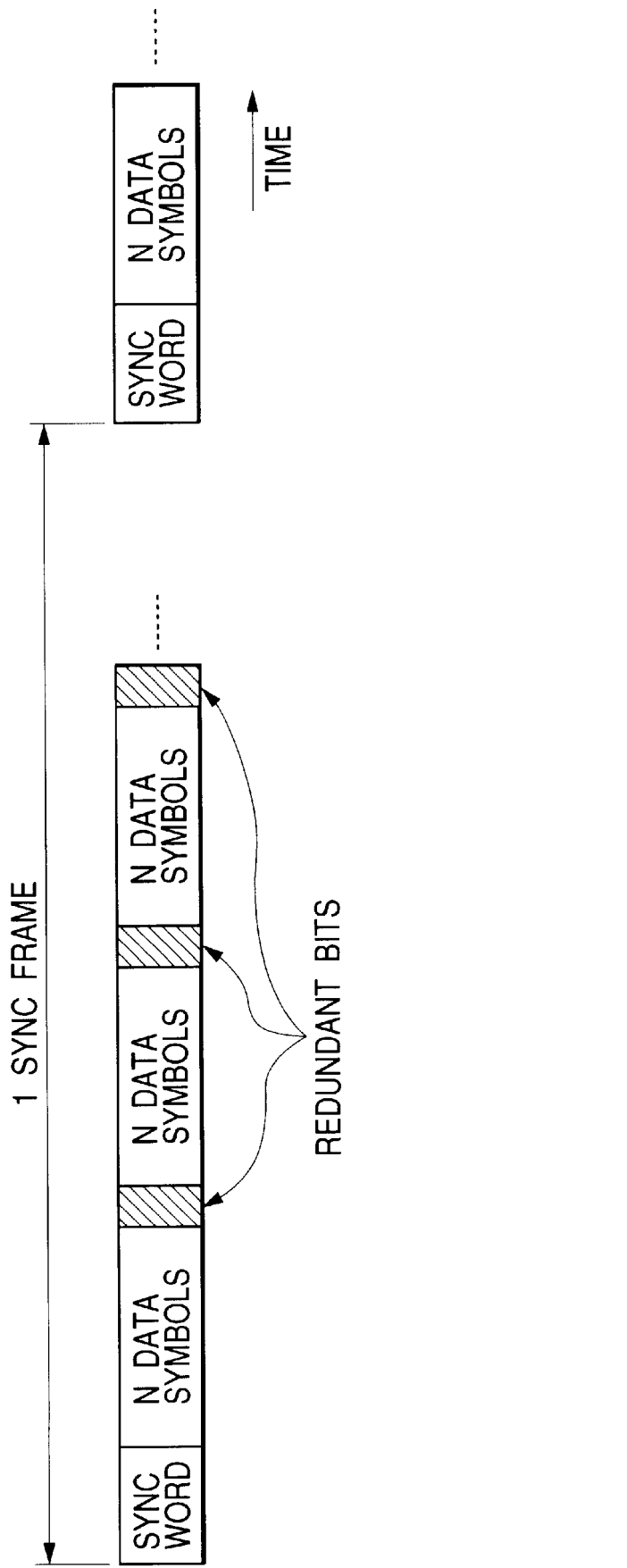
FIG. 9 is a time-domain diagram of a redundant-bit-added output-code-word sequence generated by the 4-6 modulator in FIG. 3.

With reference to FIG. 9, the output-code-word sequence fed from the 4-6 modulator 12 to the NRZI converter 14 is divided into segments each corresponding to one frame (one sync frame). Every 1-frame-corresponding segment has a head occupied by the sync word. Every 1-frame-corresponding segment except the sync word has a predetermined number of successive data symbols. Each data symbol is composed of a given number of successive output code words. Alternatively, each data symbol may be formed by only one output code word. For every frame, there is a succession of groups each of N successive data symbols where "N" denotes a predetermined natural number. For every N data symbols, the output-code-word sequence has an inserted redundant bit pattern. Accordingly, for every predetermined number of successive output code words, the output-code-word sequence has an inserted redundant bit pattern.

The basic encoder 122 in the 4-6 modulator 12 has a table containing two successive bits of "01", two successive bits of "00", and two successive bits of "10" which are different redundant bit patters respectively. In addition, the basic encoder 122 has a counter, a comparator, and a pattern deciding section. The counter operates for counting every symbol. The comparator determines whether or not the symbol count number generated by the counter reaches the predetermined number N, that is, whether or not an N-symbol group terminates. Each time the symbol count number reaches the predetermined number N, the pattern deciding section refers to the LSB of the last output code word in the N-symbol group and then reads out first and second redundant bit patterns from the table in response to the LSB of the last output code word. The first redundant bit pattern is "01" and the second redundant bit pattern is "00" when the LSB of the last output code word is "1". The first redundant bit pattern is "10" and the second redundant bit pattern is "00" when the LSB of the last output code word is "0". The first and second redundant bit patters are opposite in DSV-related polarity. The pattern deciding section adds the first redundant bit pattern to the end of the last output code word, combining the last output code word and the first redundant bit pattern into a first candidate output code word C(k)0. The pattern deciding section adds the second redundant bit pattern to the end of the last output code word, combining the last output code word and the second redundant bit pattern into a second candidate output code word C(k)1. The candidate output code words C(k)0 and C(k)1 are assigned to the path "0" and the path "1", respectively. The basic encoder 122 stores the candidate output code words C(k)0 and C(k)1 into the path memories 124 and 125, respectively.

Similar to the case where the detection-result signal outputted from the code-word selection detector 121 indicates that code-word selection is required, one of the candidate output code words C(k)0 and C(k)1 is selected as a final output code word in response to DSV calculation results. The final output code word is fed from the 4-6 modulator 12 to the NRZI converter 14. Since the first and second redundant bit patters contained in the respective candidate output code words C(k)0 and C(k)1 are opposite in DSV-related polarity, DSV control is implemented by selecting one of the candidate output code words C(k)0 and C(k)1 as a final output code word in response to the DSV calculation results.

As previously mentioned, the output-code-word sequence which occurs before the insertion of redundant bit patters follows (1, 7) RLL. The output-code-word sequence having inserted redundant bit patterns follows (1, 9) RLL since the maximum zero run length of the redundant bit patterns is equal to "2". For example, in the case where the current-table selection number S(k) is "0" and the current input code word D(k) is "12" (decimal), the corresponding output code word C(k) is "000000" (see FIG. 2). In this case, the zero run length of the MSB side of a next output code word C(k+1) is limited to "1" by (1, 7) RLL. Thus, even when a redundant bit pattern of "00" is added to the end of the output code word "0000000", the zero run length of the resultant output-code-word sequence is limited to "9". In other words, (1, 9) RLL are observed.

The 4-6 modulator 12 may be formed by a digital signal processor, a CPU, or a similar device including a combination of an input/output port, a processing section, a ROM, and a RAM. In this case, the 4-6 modulator 12 operates in accordance with a control program stored in the ROM. The encoding table 13, the initial table, and the redundant bit pattern table are provided in the ROM while the path memories 124 and 125, and the memories within the DSV circuits 126 and 127 are provided in the RAM.

Figure 10:
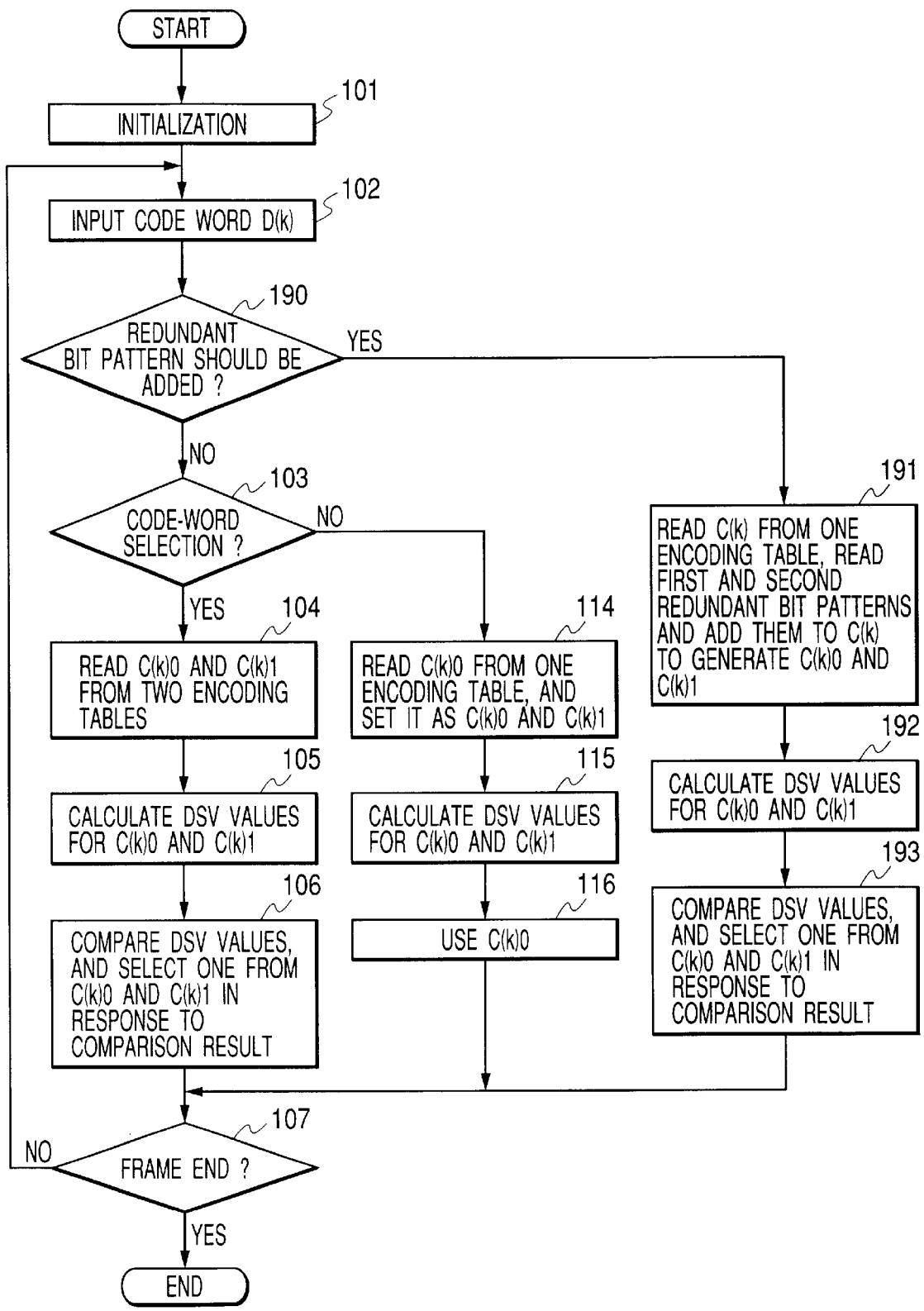
FIG. 10 is a flowchart of a segment of a control program for the 4-6 modulator in FIG. 3.

FIG. 10 is a flowchart of a segment of the control program for the 4-6 modulator 12. The program segment in FIG. 10 is executed for every sync frame. As shown in FIG. 10, a first step 101 of the program segment reads out the initial value from the initial table. The step 101 sets the current-table selection number S(k) to the read-out initial value. The step 101 initializes the DSV values (the path-0 and path-1 DSV values). After the step 101, the program advances to a step 102.

The step 102 receives a current input code word D(k). A step 190 following the step 102 decides whether or not the current input code word D(k) corresponds to an output code word having an end to which a redundant bit pattern should be added. When the current input code word D(k) corresponds to an output code word having an end to which a redundant bit pattern should be added, the program advances from the step 190 to a step 191. Otherwise, the program advances from the step 190 to a step 103.

The step 103 decides whether or not prescribed conditions for code-word selection are satisfied, that is, whether or not code-word selection should be implemented. The prescribed conditions correspond to the conditions for code-word selection in FIG. 6. Thus, the prescribed conditions relate to the detected LSB-side zero run length of a latest selected output code word C(k−1), the current-table selection number S(k), the current input code word D(k), and the MSB of a next output code word C(k+1). When the prescribed conditions are satisfied, that is, when code-word selection should be implemented, the program advances from the step 103 to a step 104. Otherwise, the program advances from the step 103 to a step 114.

The step 104 chooses two among the sub encoding tables which should be accessed. A first sub encoding table to be accessed has an ID number equal to the current-table selection number S(k). A second sub encoding table to be accessed has an ID number determined by the prescribed conditions used in the step 103. The step 104 reads out an output code word C(k)0 assigned to the current input code word D(k) from the first chosen sub encoding table. The step 104 reads out an output code word C(k)1 assigned to the current input code word D(k) from the second chosen sub encoding table. The read-out output code word C(k)0 is defined as the first candidate output code word C(k)0 assigned to the path "0". The read-out output code word C(k)1 is defined as the second candidate output code word C(k)1 assigned to the path "1".

A step 105 following the step 104 calculates a CDS value of the first candidate output code word C(k)0, and updates the path-0 DSV value of the first candidate output code word C(k)0 and previous output code words in response to the calculated CDS value. In addition, the step 105 calculates a CDS value of the second candidate output code word C(k)1, and updates the path-1 DSV value of the second candidate output code word C(k)1 and previous output code words in response to the calculated CDS value.

A step 106 subsequent to the step 105 calculates the absolute path-0 DSV value and the absolute path-1 DSV value. The step 106 compares the absolute path-0 DSV value and the absolute path-1 DSV value to decide which of the two is smaller. When the absolute path-0 DSV value is smaller than the absolute path-1 DSV value, the step 106 outputs the first candidate output code word C(k)0 as a finally-selected output code word. In addition, the step 106 replaces the contents of the second output code word C(k)1 with the contents of the first output code word C(k)0. Furthermore, the step 106 equalizes the path-1 DSV value to the path-0 DSV value. Also, the step 106 sets the current-table selection number S(k) to the value accompanying the first candidate output code word C(k)0. On the other hand, when the absolute path-0 DSV value is equal to or greater than the absolute path-1 DSV value, the step 106 outputs the second candidate output code word C(k)1 as a finally-selected output code word. In addition, the step 106 replaces the contents of the first output code word C(k)0 with the contents of the second output code word C(k)1. Furthermore, the step 106 equalizes the path-0 DSV value to the path-1 DSV value. Also, the step 106 sets the current-table selection number S(k) to the value accompanying the second candidate output code word C(k)1. After the step 106, the program advances to a step 107.

The step 114 accesses the sub encoding table having an ID number equal to the current-table selection number S(k). The step 114 reads out an output code word C(k) assigned to the current input code word D(k) from the accessed sub encoding table. The read-out output code word C(k) is defined as the first candidate output code word C(k)0 assigned to the path "0" and also the second candidate output code word C(k)1 assigned to the path "1".

A step 115 following the step 114 calculates a CDS value of the first candidate output code word C(k)0, and updates the path-0 DSV value of the first candidate output code word C(k)0 and previous output code words in response to the calculated CDS value. In addition, the step 115 calculates a CDS value of the second candidate output code word C(k)1, and updates the path-1 DSV value of the second candidate output code word C(k)1 and previous output code words in response to the calculated CDS value.

A step 116 subsequent to the step 115 outputs the first candidate output code word C(k)0 as a finally-selected output code word. In addition, the step 116 sets the current-table selection number S(k) to the value accompanying the first candidate output code word C(k)0. After the step 116, the program advances to the step 107.

The step 191 accesses the sub encoding table having an ID number equal to the current-table selection number S(k). The step 191 reads out an output code word C(k) assigned to the current input code word D(k) from the accessed sub encoding table. The step 191 accesses the redundant bit pattern table in response to the LSB of the output code word C(k). Specifically, the step 191 reads out first and second redundant bit patters from the redundant bit pattern table in response to the LSB of the output code word C(k). The first redundant bit pattern is "01" and the second redundant bit pattern is "00" when the LSB of the output code word C(k) is "1". The first redundant bit pattern is "10" and the second redundant bit pattern is "00" when the LSB of the output code word C(k) is "0". The step 191 adds the first redundant bit pattern to the end of the output code word C(k), combining the output code word C(k) and the first redundant bit pattern into a first candidate output code word C(k)0 assigned to the path "0". The step 191 adds the second redundant bit pattern to the end of the output code word C(k), combining the output code word C(k) and the second redundant bit pattern into a second candidate output code word C(k)1 assigned to the path "1".

A step 192 following the step 121 calculates a CDS value of the first candidate output code word C(k)0, and updates the path-0 DSV value of the first candidate output code word C(k)0 and previous output code words in response to the calculated CDS value. In addition, the step 192 calculates a CDS value of the second candidate output code word C(k)1, and updates the path-1 DSV value of the second candidate output code word C(k)1 and previous output code words in response to the calculated CDS value.

A step 193 subsequent to the step 192 calculates the absolute path-0 DSV value and the absolute path-1 DSV value. The step 193 compares the absolute path-0 DSV value and the absolute path-1 DSV value to decide which of the two is smaller. When the absolute path-0 DSV value is smaller than the absolute path-1 DSV value, the step 193 outputs the first candidate output code word C(k)0 as a finally-selected output code word. In addition, the step 193 replaces the contents of the second output code word C(k)1 with the contents of the first output code word C(k)0. Furthermore, the step 193 equalizes the path-1 DSV value to the path-0 DSV value. Also, the step 193 sets the current-table selection number S(k) to the value accompanying the output code word C(k). On the other hand, when the absolute path-0 DSV value is equal to or greater than the absolute path-1 DSV value, the step 193 outputs the second candidate output code word C(k)1 as a finally-selected output code word. In addition, the step 193 replaces the contents of the first output code word C(k)0 with the contents of the second output code word C(k)1. Furthermore, the step 193 equalizes the path-0 DSV value to the path-1 DSV value. Also, the step 193 sets the current-table selection number S(k) to the value accompanying the output code word C(k). After the step 193, the program advances to the step 107.

The step 107 decides whether or not the current input code word D(k) corresponds to an end of a frame. When the current input code word D(k) corresponds to an end of a frame, the program exits from the step 107 and then the current execution cycle of the program segment ends. Otherwise, the program returns from the step 107 to the step 102.

Second Embodiment

Figure 11:
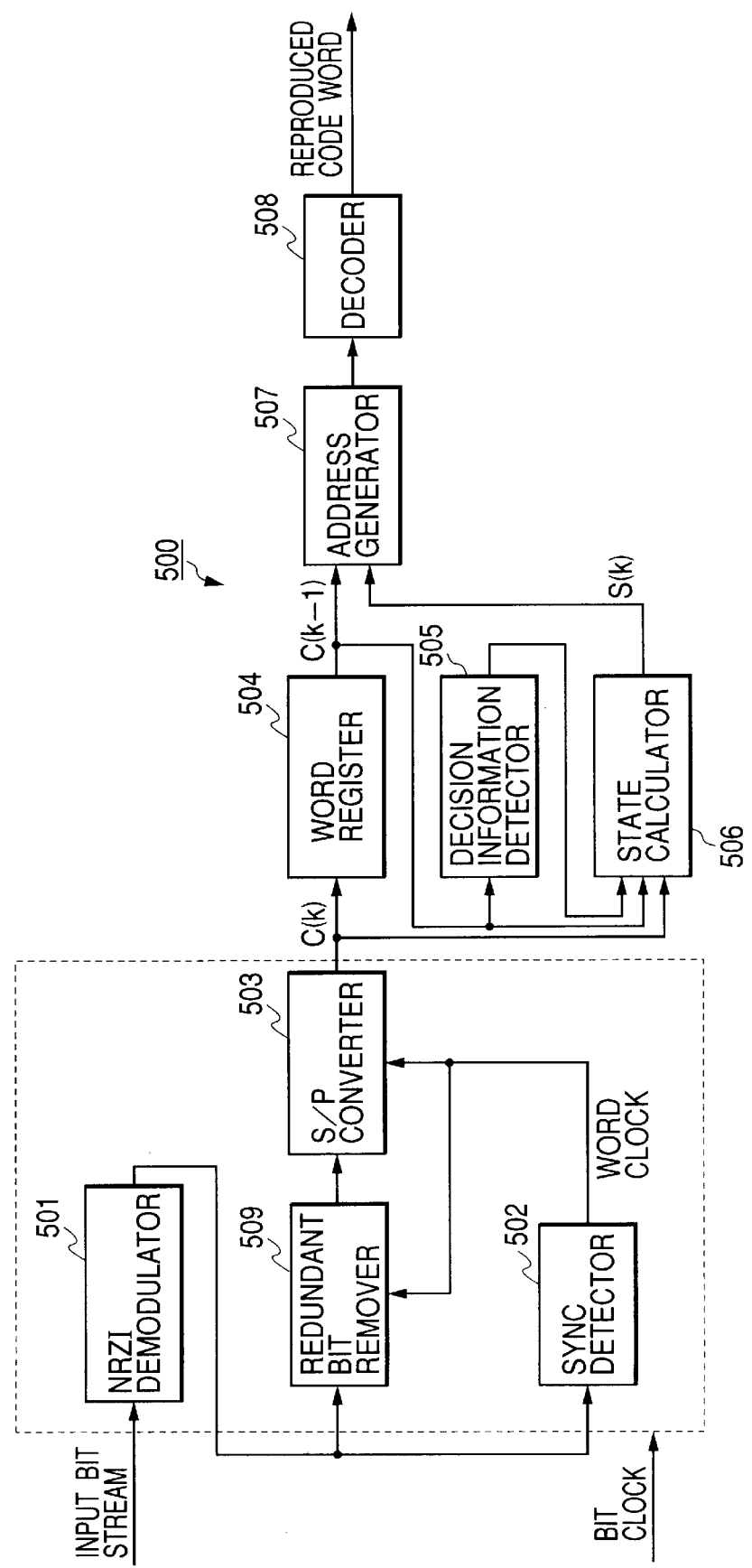
FIG. 11 is a block diagram of a demodulation apparatus according to a second embodiment of this invention.

FIG. 11 shows a demodulation apparatus 500 according to a second embodiment of this invention. The demodulation apparatus 500 receives an input bit stream divided into segments representative of input code words. The input bit stream is generated by, for example, the modulation apparatus 1 in FIG. 3. The input bit stream corresponds to, for example, the output signal of the NRZI converter 14 in FIG. 3. The demodulation apparatus 500 can reproduce original code words from the input code words.

As shown in FIG. 11, the demodulation apparatus 500 includes an NRZI demodulator 501, a sync detector 502, a serial-to-parallel (S/P) converter 503, a word register 504, a code-word decision-information detector 505, a state calculator 506, an address generator 507, a decoder 508, and a redundant bit remover 509. The NRZI demodulator 501 receives the input bit stream representing a succession of input code words. The NRZI demodulator 501 is connected with the sync detector 502 and the redundant bit remover 509. The sync detector 502 is connected with the S/P converter 503 and the redundant bit remover 509. The redundant bit remover 509 is connected with the S/P converter 503. The S/P converter 503 is connected with the word register 504 and the state calculator 506. The word register 504 is connected with the code-word decision-information detector 505, the state calculator 506, and the address generator 507. The code-word decision-information detector 505 is connected with the state calculator 506. The state calculator 506 is connected with the address generator 507. The address generator 507 is connected with the decoder 508.

The NRZI demodulator 501 subjects the input bit stream to NRZI demodulation (NRZI conversion). The NRZI demodulator 501 outputs the NRZI-demodulation-resultant signal (the NRZI-demodulation-resultant bit stream) to the sync detector 502 and the redundant bit remover 509.

The sync detector 502 detects every sync word in the NRZI-demodulation-resultant signal. The sync detector 502 generates a word clock signal in response to the detected sync words. The sync detector 502 feeds the generated word clock signal to the S/P converter 503 and the redundant bit remover 509.

A signal generator (not shown) which includes a phase-locked loop recovers a bit clock signal from the input bit stream or the NRZI-demodulation-resultant bit stream. The signal generator outputs the bit clock signal to the redundant bit remover 509.

The redundant bit remover 509 includes counters for counting pulses in the word clock signal and the bit clock signal, and a comparator for comparing the output signals of the counters with reference signals to detect every specified position in the NRZI-demodulation-resultant bit stream which is occupied by an inserted redundant bit pattern. The redundant bit remover 509 further includes a bit extractor. The bit extractor responds to the detected specified position, and removes every inserted redundant bit pattern from the NRZI-demodulation-resultant bit stream to generate a redundant-bit-less NRZI-demodulation-resultant bit stream. The redundant bit remover 509 outputs the redundant-bit-less NRZI-demodulation-resultant bit stream to the S/P converter 503.

The S/P converter 503 subjects the redundant-bit-less NRZI-demodulation-resultant bit stream to serial-to-parallel conversion in response to the word clock signal, thereby periodically generating a 6-bit parallel-form signal segment handled as an input code word C(k). Thus, the S/P converter 503 changes the redundant-bit-less NRZI-demodulation-resultant bit stream into a sequence of input code words. The S/P converter 503 outputs the input code word C(k) to the word register 504 and the state calculator 506. The input code word C(k) is written into the word register 504. The input code word C(k) is temporarily stored in the word register 504 before being outputted therefrom as a delayed input code word C(k−1). Specifically, the word register 504 delays the input code word C(k) by a time interval corresponding to one word. The delayed input code word C(k−1) is fed from the word register 504 to the code-word decision-information detector 505, the state calculator 506, and the address generator 507.

The code-word decision-information detector 505 detects a code-word-related decision information in response to the delayed input code word C(k−1). The code-word decision-information detector 505 informs the state calculator 506 of the detected decision information. The state calculator 506 computes an encoding state S(k) from the input code word C(k), the detected decision-information, and the delayed input code word C(k−1). The computed encoding state S(k) corresponds to the sub encoding table used in generating the input code word C(k). In other words, the computed encoding state S(k) is equal to the next-table selection number S(k+1) accompanying the delayed input code word C(k−1) and used in an encoder side (a modulation side). Thus, the next-table selection number S(k+1) accompanying the delayed input code word C(k−1) is recovered. The state calculator 506 informs the address generator 507 of the encoding state S(k), that is, the next-table selection number S(k+1) accompanying the delayed input code word C(k−1). The address generator 507 produces an address signal in response to the delayed input code word C(k−1) and the encoding state S(k). The address generator 507 outputs the produced address signal to the decoder 508. The decoder 508 contains a decoding table having an array of 4-bit output code words at different addresses. The decoding table is accessed in response to the address signal. One output code word D(k−1) at an address corresponding to the address signal is selected from the output code words in the decoding table. The decoder 508 feeds the selected output code word D(k−1) to an external as a reproduced original code word D(k−1).

Specifically, the decoding table includes an array of cells each having a set of an input code word C(k−1), an output code word D(k−1), and an encoding state S(k). As previously indicated, the encoding state S(k) corresponds to a next-table selection number S(k+1) accompanying the input code word C(k−1). An output code word D(k−1) can be decided in response to a set of an input code word C(k−1) and an encoding state S(k) by referring to the decoding table. An example of the contents of the decoding table is shown in FIG. 12.

Input code words can be grouped into three cases "0", "1", and "2" according to LSB-side zero run length. The cases "0", "1", and "2" are given to decision information of "0", "1", and "2", respectively. Specifically, input code words each having an LSB-side zero run length of "0" are assigned to the case "0", that is, decision information of "0". Input code words each having an LSB-side zero run length of "1", "2", or "3" are assigned to the case "1", that is, decision information of "1". Input code words having LSB-side zero run lengths of "4", "5", or "6" are assigned to the case "2", that is, decision information of "2". Each of the input code words in the case "0" (corresponding to decision information of "0") is always followed by an input code word which results from an encoding procedure using the sub encoding table denoted by an ID number of "0" or "1". Each of the input code words in the case "1" (corresponding to decision information of "1") is always followed by an input code word which results from an encoding procedure using the sub encoding table denoted by an ID number of "1", "2", or "3". Each of the input code words in the case "2" (corresponding to decision information of "2") is always followed by an input code word which results from an encoding procedure using the sub encoding table denoted by an ID number of "2" or "3".

The code-word decision-information detector 505 contains a table representative of the previously-mentioned assignment of the input code words to the cases "0", "1", and "2" (decision information of "0", "1", and "2") which depends on LSB-side zero run length. The code-word decision-information detector 505 detects the LSB-side zero run length of the delayed input code word C(k−1). The code-word decision-information detector 505 accesses the assignment table in response to the detected zero run length, and thereby detects the decision information to which the delayed input code word C(k−1) is assigned. The code-word decision-information detector 505 informs the state calculator 506 of the detected decision information. The state calculator 506 computes an encoding state S(k) from the input code word C(k), the delayed input code word C(k−1), and the detected decision information according to a predetermined algorithm. The computed encoding state S(k) corresponds to the sub encoding table used in generating the input code word C(k). In other words, the computed encoding state S(k) is equal to the next-table selection number S(k+1) accompanying the delayed input code word C(k−1) and used in an encoder side. The state calculator 506 notifies the encoding state S(k), that is, the next-table selection number S(k+1) accompanying the delayed input code word C(k−1), to the address generator 507. The address generator 507 produces an address signal in response to the delayed input code word C(k−1) and the encoding state S(k). The address generator 507 outputs the produced address signal to the decoder 508. The decoder 508 accesses the decoding table in response to the address signal. An output code word D(k−1) corresponding to the address signal, that is, an output code word D(k−1) corresponding to a set of the delayed input code word C(k−1) and the encoding state S(k), is read out from the decoding table. The decoder 508 feeds the read-out output code word D(k−1) to an external as a reproduced original code word D(k−1).

An example of the predetermined algorithm used by the state calculator 506 is as follows.

Algorithm in C-language-based Version:

```
if (decision information == 0 [
    if (C(k) is in sub encoding table having ID = 0)
        S(k)=0;
    elseif (C(k) is in sub encoding table having ID = 1)
        S(k)=1;]
if (decision information == 1 [
    if (C(k) is in sub encoding table having ID = 1)
        S(k)=1;
    elseif (C(k) is in sub encoding table having ID = 2)
        S(k)=2;
    elseif (C(k) is in sub encoding table having ID = 3 || 1)
        S(k)=3;
    elseif (C(k)==0 && C(k−1)==32)
        S(k)=3;
    elseif (C(k)==0 && C(k−1)==42)
        S(k)=2;]
if (decision information == 2 [
    if (C(k) is in sub encoding table having ID = 3 || 9 || 5 || 2)
        S(k)=3;
    elseif (C(k) is in sub encoding table having ID = 2 || 4 || 10 || 8)
        S(k)=2;
    elseif (C(k)==21)
        S(k)=0;]
```

In the above algorithm: "==" denotes "equal to"; "&&" denotes "and"; and "||" denotes "or".

FIG. 13 shows a succession of input code words of "010000", "001001", "000001", "000101", and "010001". In the case where the input code word C(k−1) of interest is "010000" and the immediately-following input code word C(k) is "001001", since the LSB-side zero run length of the input code word C(k−1) is "4", the decision information corresponding to the input code word C(k−1) is found to be "2" by referring to the previously-mentioned assignment table. The encoding state S(k), that is, the next-table selection number S(k+1) accompanying the input code word C(k−1), is found to be "3" according to the predetermined algorithm using the input code word C(k) and the decision information of "2". The input code word C(k−1) of interest is decoded into an output code word D(k−1) of "15" in decimal by referring to the decoding table (see FIG. 12).

In the case where the input code word C(k−1) of interest is "001001" and the immediately-following input code word C(k) is "000001", since the LSB-side zero run length of the input code word C(k−1) is "0", the decision information corresponding to the input code word C(k−1) is found to be "0" by referring to the previously-mentioned assignment table. The encoding state S(k), that is, the next-table selection number S(k+1) accompanying the input code word C(k−1), is found to be "0" according to the predetermined algorithm using the input code word C(k) and the decision information of "0". The input code word C(k−1) of interest is decoded into an output code word D(k−1) of "0" in decimal by referring to the decoding table (see FIG. 12).

In the case where the input code word C(k−1) of interest is "000001" and the immediately-following input code word C(k) is "000101", since the LSB-side zero run length of the input code word C(k−1) is "0", the decision information corresponding to the input code word C(k−1) is found to be "0" by referring to the previously-mentioned assignment table. The encoding state S(k), that is, the next-table selection number S(k+1) accompanying the input code word C(k−1), is found to be "1" according to the predetermined algorithm using the input code word C(k) and the decision information of "0". The input code word C(k−1) of interest is decoded into an output code word D(k−1) of "1" in decimal by referring to the decoding table (see FIG. 12).

In the case where the input code word C(k−1) of interest is "000101" and the immediately-following input code word C(k) is "010001", since the LSB-side zero run length of the input code word C(k−1) is "0", the decision information corresponding to the input code word C(k−1) is found to be "0" by referring to the previously-mentioned assignment table. The encoding state S(k), that is, the next-table selection number S(k+1) accompanying the input code word C(k−1), is found to be "0" according to the predetermined algorithm using the input code word C(k) and the decision information of "0". The input code word C(k−1) of interest is decoded into an output code word D(k−1) of "2" in decimal by referring to the decoding table (see FIG. 12).

In FIG. 13, the input code word C(k−1) being "001001" is generated by an encoder side (a modulation side) through the code-word selection procedure for the DSV control. Specifically, in the encoder side, a first candidate modulation-resultant code word being "101001" and assigned to an original code word of "0" (decimal) is read out from the sub encoding table (see FIG. 2) having an ID number of "3" while a second candidate modulation-resultant code word being "001001" and assigned to the original code word is read out from the sub encoding table having an ID number of "1". The encoder side selects the second candidate modulation-resultant code word. Thus, the encoder side uses "001001" instead of "101001". Although the code-word selection and change is implemented by the encoder side in this way, the demodulation apparatus 500 correctly decodes the input code word C(k−1) being "001001" into an original code word D(k−1) of "0" as previously mentioned.

What is claimed is:

1. A modulation method comprising the steps of:

generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information;

adding two redundant bits to every prescribed number of the successive generated output code words for digital-sum-variation control; and sequentially connecting the generated output code words and the added redundant bits into a redundant-bit-added output-code-word sequence which follows predetermined run length limiting rules (1, k)RLL, where "k" denotes a predetermined natural number equal to 9.

2. A modulation method as recited in claim 1, wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising the steps of generating a first candidate current output code word in response to a current input code word equal to one of the prescribed input code words by referring to the first specified one of the encoding tables, and generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the predetermined run length limiting rules (1, k)RLL.

3. A modulation method as recited in claim 2, further comprising the step of selecting one from the first and second candidate current output code words as a final current output code word.

4. A modulation method as recited in claim 2, further comprising the steps of:

calculating a first CDS of the first candidate current output code word;

updating a first DSV of the first candidate current output code word and previous final output code words in response to the first CDS;

calculating a second CDS of the second candidate current output code word;

updating a second DSV of the second candidate current output code word and previous final output code words in response to the second CDS;

determining which of an absolute value of the first DSV and an absolute value of the second DSV is smaller; and selecting one from the first and second candidate current output code words which corresponds to the smaller DSV absolute value as a final current output code word.

5. A demodulation method of demodulating a sequence of 6-bit code words and redundant bits which is generated by the modulation method in claim 1, the demodulation method comprising the steps of:

removing the redundant bits from the sequence to generate a redundant-bit-less code-word sequence;

recovering encoding-table designation information from the redundant-bit-less code-word sequence, the encoding-table designation information representing which of encoding tables has been used in generating a code word immediately following a code word of interest; and demodulating the code word of interest into an original code word by referring to a decoding table in response to the recovered encoding-table designation information.

6. An information transmission method of transmitting a sequence of code words and redundant bits which is generated by the modulation method in claim 1.

7. A modulation apparatus comprising:

means for generating a 6-bit output code word in response to every 4-bit input code word by referring to a set of encoding tables, wherein the encoding tables contain output code words assigned to input code words, and contain encoding-table designation information accompanying each output code word, wherein the encoding-table designation information designates an encoding table among the encoding tables which is used next to generate an output code word immediately following the output code word accompanied with the encoding-table designation information;

means for adding two redundant bits to every prescribed number of the successive generated output code words for digital-sum-variation control; and sequentially connecting the generated output code words and the added redundant bits into a redundant-bit-added output-code-word sequence which follows predetermined run length limiting rules (1, k)RLL, where "k" denotes a predetermined natural number equal to 9.

8. A modulation apparatus as recited in claim 7, wherein NRZI conversion results of output code words in first specified one of the encoding tables which are assigned to prescribed input code words are opposite in polarity to NRZI conversion results of output code words in second specified one of the encoding tables which are assigned to the prescribed input code words, and further comprising means for generating a first candidate current output code word in response to a current input code word equal to one of the prescribed input code words by referring to the first specified one of the encoding tables, and means for generating a second candidate current output code word in response to the current input code word equal to said one of the prescribed input code words by referring to the second specified one of the encoding tables, wherein a succession of a specified immediately-preceding output code word and the first candidate current output code word and also a succession of the specified immediately-preceding output code word and the second candidate current output code follow the predetermined run length limiting rules (1, k)RLL.

9. A modulation apparatus as recited in claim 8, further comprising means for selecting one from the first and second candidate current output code words as a final current output code word.

10. A modulation apparatus as recited in claim 8, further comprising:
  means for calculating a first CDS of the first candidate current output code word;
  means for updating a first DSV of the first candidate current output code word and previous final output code words in response to the first CDS;
  means for calculating a second CDS of the second candidate current output code word;
  means for updating a second DSV of the second candidate current output code word and previous final output code words in response to the second CDS;
  means for determining which of an absolute value of the first DSV and an absolute value of the second DSV is smaller; and
  means for selecting one from the first and second candidate current output code words which corresponds to the smaller DSV absolute value as a final current output code word.

11. A demodulation apparatus for demodulating a sequence of 6-bit code words and redundant bits which is generated by the modulation apparatus in claim 5, the demodulation apparatus comprising:
  means for removing the redundant bits from the sequence to generate a redundant-bit-less code-word sequence;
  means for recovering encoding-table designation information from the redundant-bit-less code-word sequence, the encoding-table designation information representing which of encoding tables has been used in generating a code word immediately following a code word of interest; and
  means for demodulating the code word of interest into an original code word by referring to a decoding table in response to the recovered encoding-table designation information.

12. An information recording medium storing a sequence of code words and redundant bits which is generated by the modulation apparatus in claim 5.

13. An information transmission apparatus for transmitting a sequence of code words and redundant bits which is generated by the modulation apparatus in claim 7.

* * * * *